United States Patent
Chen et al.

(10) Patent No.: US 9,589,646 B2
(45) Date of Patent: Mar. 7, 2017

(54) PAGE BUFFER CIRCUIT HAVING BIAS VOLTAGE APPLICATION UNIT AND OPERATING METHOD OF SAME

(71) Applicant: MACRONIX INTERNATIONAL CO., LTD., Hsinchu (TW)

(72) Inventors: Chung-Kuang Chen, Hsinchu (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 171 days.

(21) Appl. No.: 14/554,293

(22) Filed: Nov. 26, 2014

(65) Prior Publication Data

US 2016/0148692 A1 May 26, 2016

(51) Int. Cl.
| | |
|---|---|
| *G11C 16/04* | (2006.01) |
| *G11C 16/10* | (2006.01) |
| *G06F 3/06* | (2006.01) |
| *G11C 7/02* | (2006.01) |

(52) U.S. Cl.
CPC ............ *G11C 16/10* (2013.01); *G06F 3/0619* (2013.01); *G06F 3/0656* (2013.01); *G06F 3/0679* (2013.01); *G11C 7/02* (2013.01); *G11C 16/0483* (2013.01)

(58) Field of Classification Search
CPC ..... G11C 16/0483; G11C 16/26; G11C 16/10; G11C 11/5628; G11C 16/30; G11C 7/1051
USPC .......................... 365/185.12, 185.18, 189.05
See application file for complete search history.

(56) References Cited

U.S. PATENT DOCUMENTS

| 8,773,921 B2 | 7/2014 | Ruby et al. | |
|---|---|---|---|
| 9,293,177 B2* | 3/2016 | Choi | ......................... G11C 7/02 |
| 2011/0157993 A1* | 6/2011 | Kim | ....................... G11C 16/26 365/185.18 |

* cited by examiner

*Primary Examiner* — David Lam
(74) *Attorney, Agent, or Firm* — Finnegan, Henderson, Farabow, Garrett & Dunner LLP

(57) ABSTRACT

A page buffer circuit includes a plurality of page buffers including a first page buffer. The first page buffer is configured to load input data of the first page buffer, and input data of at least one neighboring page buffer. The first page buffer is also configured to apply a bias corresponding to the input data of the first page buffer, and the input data of the at least one neighboring page buffer to a bit line.

20 Claims, 34 Drawing Sheets

| 2700 | | 2710 | 2720 | 2730 | 2740 | 2750 |
|---|---|---|---|---|---|---|
| Before data processing | OL = Right neighbor (cell C) data | 1 | 1 | 0 | 0 | Self data of cell A is 1 |
| | BL = Left neighbor (cell B) data | 1 | 0 | 0 | 1 | |
| After data processing | OL | 0 | 1 | 0 | 1 | 1 |
| | BL | 1 | 0 | 0 | 0 | 1 |
| | | Both side inhibit | One side inhibit | No side inhibit | One side inhibit | Self inhibit |
| BL Compensation Bias Level | | VH | VL | GND | VL | VDD |

FIG. 27

PAGE BUFFER CIRCUIT HAVING BIAS VOLTAGE APPLICATION UNIT AND OPERATING METHOD OF SAME

FIELD OF THE DISCLOSURE

The present disclosure relates to a page buffer circuit and operation method of the same and, more particularly, to a page buffer circuit that can reduce cell interference.

BACKGROUND

A non-volatile memory device is a semiconductor device capable of continuously storing data even when the supply of electricity is removed. A NAND flash memory device is a type of non-volatile memory device that has been developed. The NAND flash memory device includes a memory array having a plurality of memory cells arranged in parallel strings. A neighboring cell interference problem may occur between cells in neighboring strings.

SUMMARY

According to an embodiment of the disclosure, a page buffer circuit includes a plurality of page buffers including a first page buffer. The first page buffer is configured to load input data of the first page buffer, and input data of at least one neighboring page buffer. The first page buffer is also configured to apply a bias corresponding to the input data of the first page buffer, and the input data of the at least one neighboring page buffer to a bit line.

According to another embodiment of the disclosure, an integrated circuit includes a memory array including a plurality of memory strings each including a plurality of memory cells, and a page buffer circuit including a plurality of page buffers respectively connected to the plurality of memory strings. Each one of the page buffers is connected to at least one of a right-side neighboring page buffer and a left-side neighboring page buffer. The integrated circuit also includes a control circuit configured to perform the following operations on at least a first page buffer of the plurality of page buffers: a data input operation that inputs data to the first page buffer, a data shifting operation that shifts input data of at least one of a right-side neighboring page buffer and a left-side neighboring page buffer of the first page buffer, to the first page buffer, a data processing operation that processes the input data of the first page buffer and the input data of the at least one of the right-side neighboring page buffer and the left-side neighboring page buffer, to determine a bias voltage level, and a programming operation that applies a bias voltage having the determined bias voltage level to a bit line of a memory string corresponding to the first page buffer.

According to still another embodiment, a method of programming a memory cell connected to a page buffer includes inputting data to the page buffer, shifting input data of at least one of a first neighboring page buffer and a second neighboring page buffer to the page buffer, processing the input data of the page buffer and the input data of the at least one of the first and second neighboring page buffers to determine a bias voltage level, and applying the determined bias voltage level to a bit line corresponding to the memory cell.

The accompanying drawings, which are incorporated in and constitute a part of this specification, illustrate disclosed embodiments and, together with the description, serve to explain the disclosed embodiments.

BRIEF DESCRIPTION OF THE DRAWINGS

FIG. 27 is a table summarizing the data at different terminals of a page buffer before and after a data processing operation.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Figure 1:
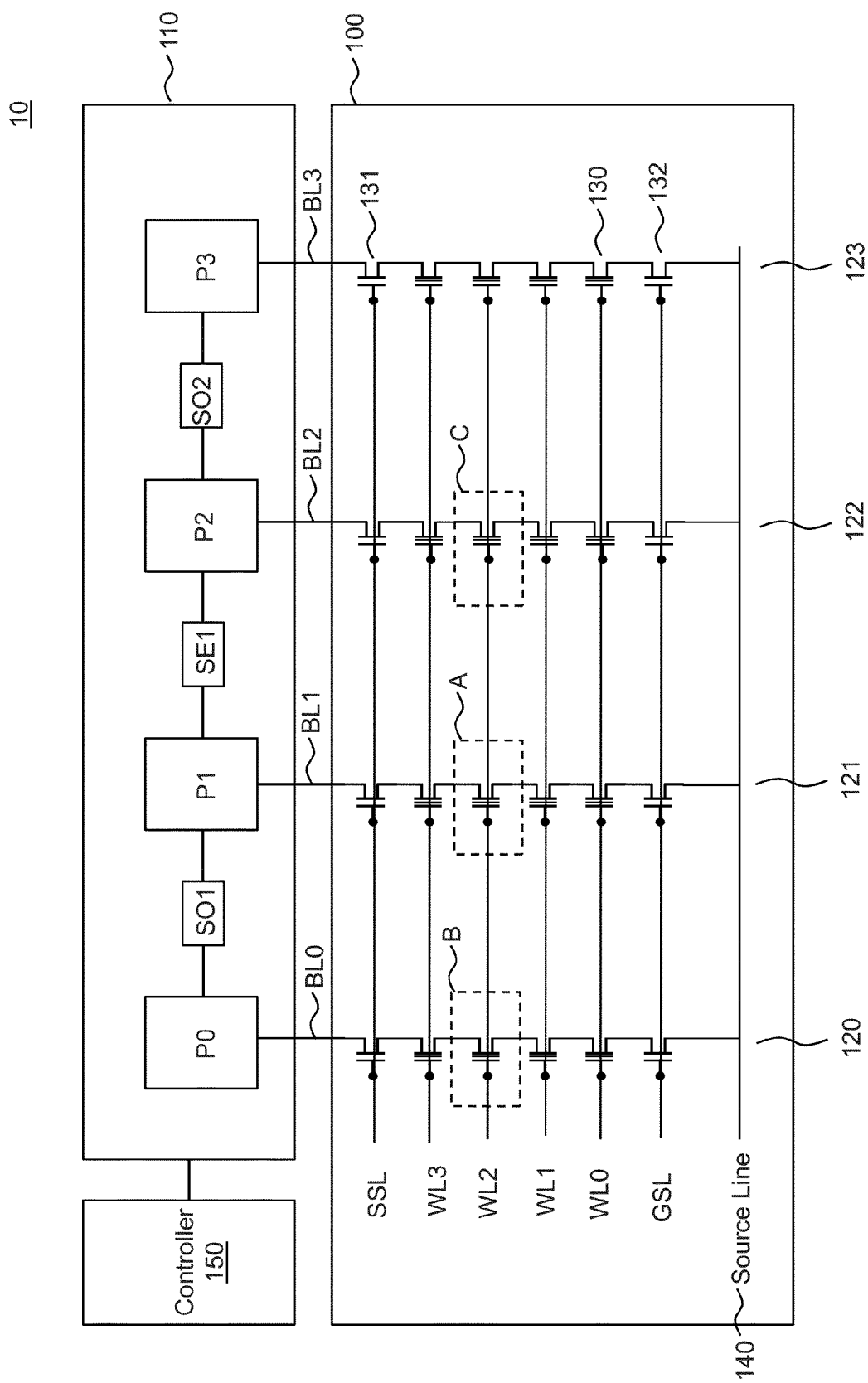
FIG. 1 is a block diagram of an integrated circuit 10, according to an illustrated embodiment.

FIG. 1 is a block diagram of an integrated circuit 10, according to an illustrated embodiment. Integrated circuit 10 includes a memory array 100, a page buffer circuit 110, and a controller 150. Memory array 100 includes a plurality of, for example, four (4) memory strings 120-123. Each memory string 120-123 includes a plurality of, for example, four (4), memory cells 130, one string select line transistor 131, and one source select line transistor 132 connected in series and corresponds to a column of memory array 100. Each memory string 120-123 is connected between a source line 140 and a corresponding bit line BL0-BL3. A plurality of, e.g., four (4), word lines WL0-WL3 are arranged orthogonally to the plurality of memory strings 120-123. Each word line WL0-WL3 is connected to the gate electrodes of a corresponding row of memory cells 130. A string select line (SSL) is arranged orthogonally to the plurality of memory strings 120-123. SSL is connected to the gate electrodes of a row of string select line transistors 131. A source select lines (GSL) is arranged orthogonally to the plurality of memory strings 120-123. GSL is connected to the gate electrodes of a row of source select line transistors 132.

Page buffer circuit 110 includes page buffers P0-P3. Each page buffer P0-P3 is connected to a corresponding bit line BL0-BL3. Each page buffer P0-P3 is connected to a neighboring page buffer via either an odd switch SO or an even switch SE. Specifically, page buffer P0 is connected to its right-side neighbor, i.e., page buffer P1, via an odd switch SO1. Page buffer P1 is connected to its right-side neighbor, i.e., page buffer P2, via even switch SE1. Page buffer P2 is connected to its right-side neighbor, i.e., page buffer P3, via odd switch SO2.

In the embodiment illustrated in FIG. 1, memory array 100 includes four (4) memory strings 120-123 and four (4) word lines WL0-WL3, one SSL, and one GSL; and page buffer circuit 110 includes four (4) page buffers P0-P3. However, the disclosed numbers of memory cells, memory strings, word lines, bit lines, and page buffers are not so limited. That is, memory array 100 can include any number of memory cells, memory strings, and word lines, arranged in an array. Similarly, page buffer circuit 110 can include any number of page buffers respectively connected to the bit lines in memory array 100.

Controller 150 controls the operation of each one of page buffers P0-P3 in page buffer circuit 110. Controller 150 can be implemented by using a special-purpose logic circuitry known in the art. Alternatively, controller 150 can be implemented by using a general-purpose processor, which executes a program stored in a storage device. Still alternatively, controller 150 can be implemented by using a combination of the special-purpose logic circuitry and the general-purpose processor.

Figure 2A:
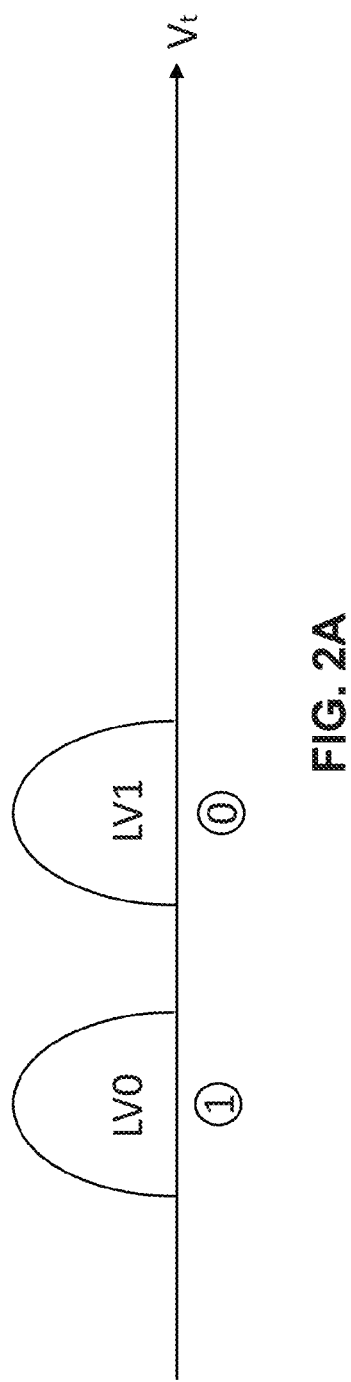
FIG. 2A is a diagram of a threshold voltage $V_{th}$ distribution of an SLC application.
Figure 2B:
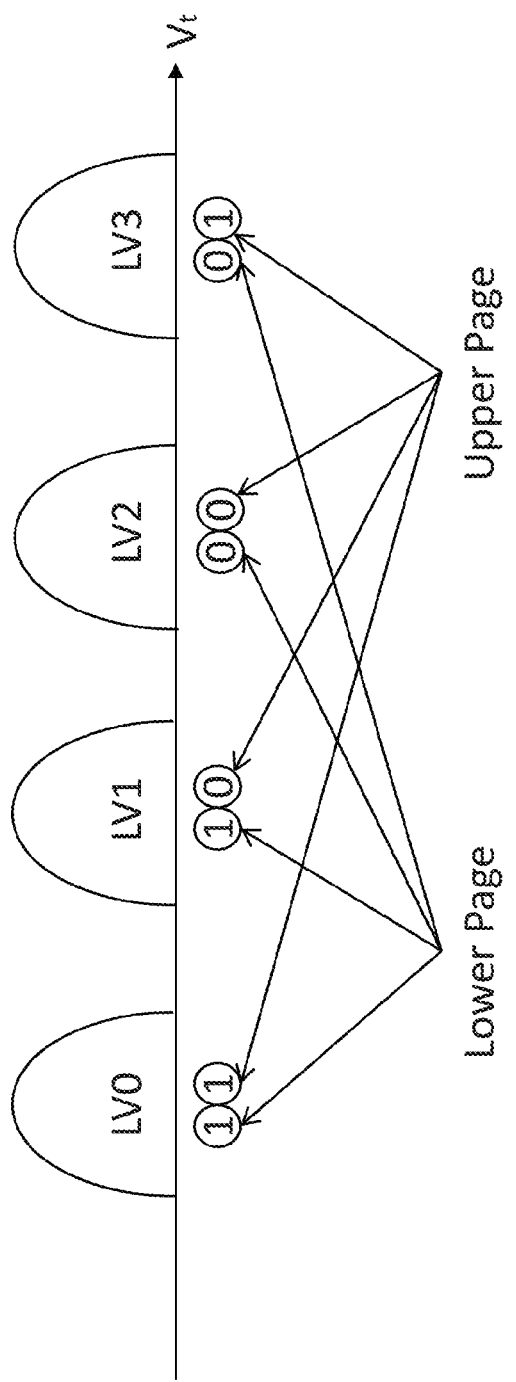
FIG. 2B is a diagram of a threshold voltage $V_{th}$ distribution of an MLC application.

Each memory cell 130 included in memory array 100 may be a single level cell (SLC) or a multi-level cell (MLC). As used herein, an SLC can store a single bit of data, and an MLC can store multiple bits of data. FIG. 2A is a diagram of a threshold voltage $V_{th}$ distribution of an SLC application. FIG. 2B is a diagram of a threshold voltage $V_{th}$ distribution of an MLC application.

Referring to FIG. 2A, there are two $V_{th}$ distributions LV0 and LV1 for the SLC. The two $V_{th}$ distributions LV0 and LV1 correspond to two program states defined as "1" and "0", respectively.

Referring to FIG. 2B, there are four $V_{th}$ distributions LV0, LV1, LV2, and LV3 for the MLC. The four $V_{th}$ distributions LV0, LV1, LV2, and LV3 correspond to four program states defined as, from low to high, "11", "10", "00", and "01", respectively. In each program state, the left bit is referred to as data of a lower page, and the right bit is referred to as data of an upper page.

The SLC and MLC are typically programmed by using an incremental step pulse programming (ISPP) technique. According to the ISPP technique, in order to program a selected cell to reach a targeted level, a sequence of programming and verification operations are performed. In each programming operation, a program pulse having a magnitude stepped up, by a constant increment, relative to the program pulse in the previous programming operation, is applied to the selected cell. Between each programming operation, a program-verification operation is performed, and the data on the selected cell is sensed, to determine whether the threshold voltage of the selected cell exceeds a program verification level set at the lower end of the Vt distribution. For SLC as illustrated in FIG. 2A, a program verification level is indicated as "PV" at the lower end of Vt distribution LV1. For MLC as illustrated in FIG. 2B, program verification levels are indicated as "PV1", "PV2", and "PV3" at the lower ends of Vt distributions LV1, LV2, and LV3, respectively. In FIGS. 2A and 2B, LV0 represents an erase level.

During each programming operation, the programming status of a selected cell (e.g., cell A illustrated in FIG. 1) may be affected by the programming status of the neighboring cells (e.g., cells B and C illustrated in FIG. 1). Therefore, each page buffer P1 and P2 in page buffer circuit 110 of the disclosed embodiment processes the data to be programmed to the corresponding selected cell as well as the data to be programmed to the neighboring cells, to determine a bit line compensation bias level to be applied to the bit line of the selected cell. Each one of edge page buffers P0 and P3 also processes its neighbor's data, but uses dummy latch data for its missing neighbor.

Page Buffer Structure

Figure 3:
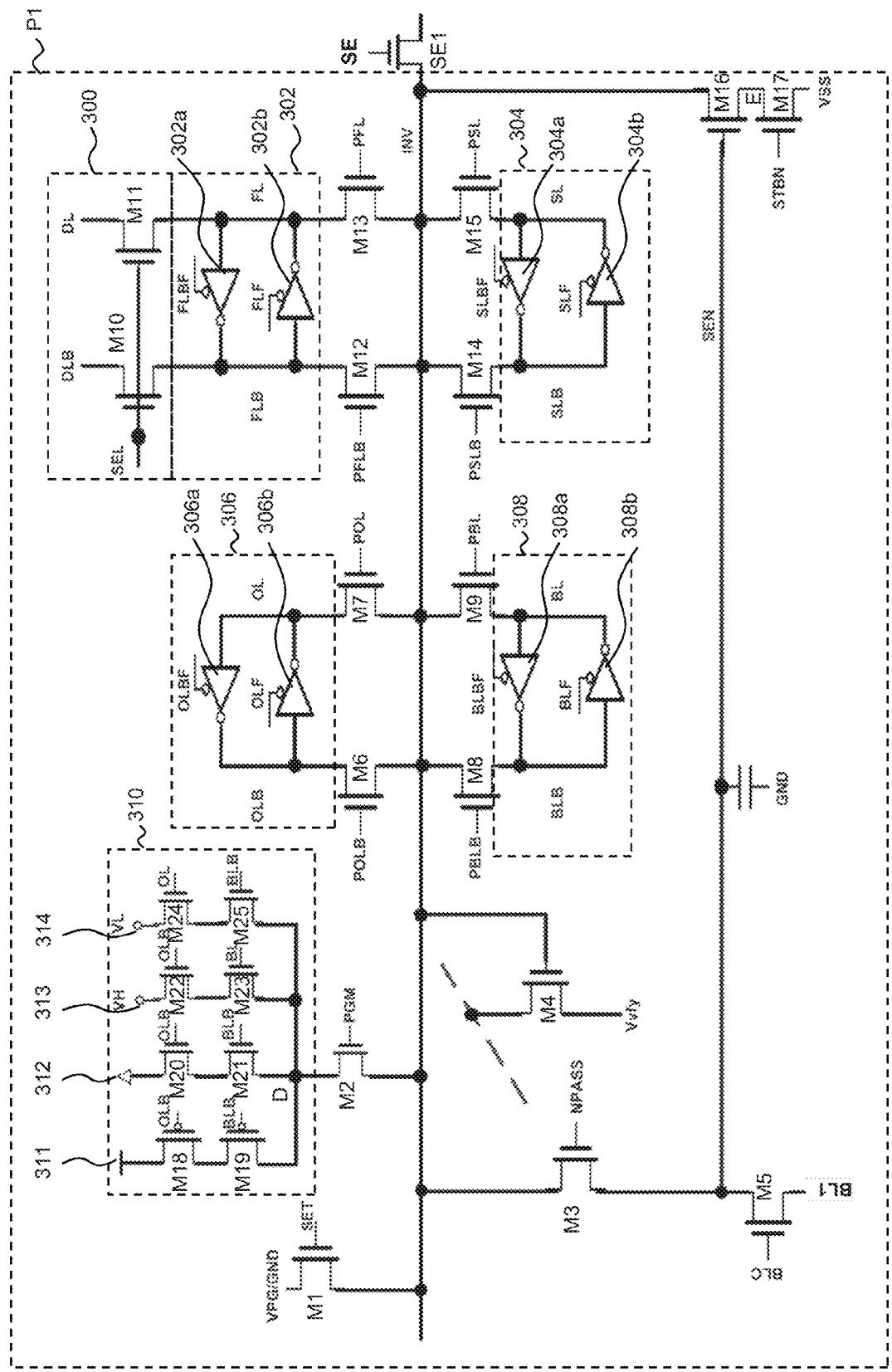
FIG. 3 is a circuit diagram of a page buffer, according to an illustrated embodiment.

FIG. 3 is a circuit diagram of page buffer P1 illustrated in FIG. 1, according to an illustrated embodiment. The structures of page buffers P0, P2, and P3 are similar to that of page buffer P1. Therefore, separate descriptions of the structures of page buffers P0, P2, and P3 are not provided.

Referring to FIG. 3, page buffer P1 includes a data input unit 300, a first latch 302, a second latch 304, a one-side latch 306, a both-side latch 308, a bias voltage application unit 310, and switches M1-M17 that are N-type metal oxide semiconductor (NMOS) transistors.

Data input unit 300 receives data (e.g., the data of the lower page or the upper page for MLC) from an external data decoder (not illustrated in FIG. 3). Data input unit 300 includes switches M11 and M10, that are NMOS transistors. Switch M11 has a first source/drain (S/D) terminal connectable to receive a data signal DL, a second S/D terminal connected to first latch 302, and a gate connectable to receive a control signal SEL. Switch M10 has a first S/D terminal connectable to receive a data signal DLB, a second S/D terminal connected to first latch 302, and a gate connectable to receive the control signal SEL. The data received from the external data decoder can be either "1" or "0". Data signal DL is phase-inverse to data signal DLB. That is, when $V_{DL}$="0", $V_{DLB}$="1"; and when $V_{DL}$=1, $V_{DLB}$=0.

First latch 302 includes terminals FL and FLB for loading the data from data input unit 300. Terminal FL is connected to the second S/D terminal of switch M11 of data input unit 300. Terminal FLB is connected to the second S/D terminal of switch M10 of data input unit 300. First latch 302 includes two inverters 302a and 302b reversely coupled to each other in parallel such that a voltage $V_{FL}$ at terminal FL is phase-inverse to a voltage $V_{FLB}$ at terminal FLB. That is, when $V_{FL}$="0", $V_{FLB}$="1"; and when $V_{FL}$=1, $V_{FLB}$=0. First latch 302 is connected to a common terminal of page buffer P1, i.e., terminal INV, via switches M12 and M13. Switch M12 includes a first S/D terminal connected to terminal FLB, a second S/D terminal connected to terminal INV, and a gate connectable to receive a control signal PFLB. Switch M13 includes a first S/D terminal connected to terminal FL, a second S/D terminal connected to terminal INV, and a gate connectable to receive a control signal PFL.

Second latch 304 includes terminals SL and SLB for storing the data from first latch 302. Second latch 304 also includes two inverters 304a and 304b reversely coupled to each other in parallel such that a voltage $V_{SL}$ at terminal SL is phase-inverse to a voltage $V_{SLB}$ at terminal SLB. That is, when $V_{SL}$="0", $V_{SLB}$="1"; and when $V_{SL}$=1, $V_{SLB}$=0. Second latch 304 is connected to terminal INV via switches M14 and M15. Switch M14 includes a first S/D terminal connected to terminal SLB, a second S/D terminal connected to terminal INV, and a gate connectable to receive a control signal PSLB. Switch M15 includes a first S/D terminal connected to terminal SL, a second S/D terminal connected to terminal INV, and a gate connectable to receive a control signal PSL.

One-side latch 306 and both-side latch 308 monitor the data on the neighboring page buffers, and process the data to determine a bias voltage to be applied to a selected cell corresponding to page buffer P1. For example, referring to FIG. 1, in order to program the data stored in page buffer P1 into cell A on WL2, one-side latch 306 and both-side latch 308 of page buffer P1 monitor the data to be programmed into neighboring cells B and C by monitoring the data on the neighboring page buffers P0 and P2. Detailed explanation regarding the operation of one-side latch 306 and both-side latch 308 will be provided.

Referring back to FIG. 3, one-side latch 306 includes terminals OL and OLB, and two inverters 306a and 306b reversely coupled to each other in parallel such that a voltage $V_{OL}$ at terminal OL is phase-inverse to a voltage $V_{OLB}$ at terminal OLB. One-side latch 306 is connected to terminal INV via switches M6 and M7 Switch M6 includes a first S/D terminal connected to terminal OLB, a second S/D terminal connected to terminal INV, and a gate connectable to receive a control signal POLB. Switch M7 includes a first S/D terminal connected to terminal OL, a second S/D terminal connected to terminal INV, and a gate connectable to receive a control signal POL.

Both-side latch 308 includes terminals BL and BLB, and two inverters 308a and 308b reversely coupled to each other in parallel such that a voltage $V_{BL}$ at terminal BL is phase-inverse to a voltage $V_{BLB}$ at terminal BLB. Both-side latch 308 is connected to terminal INV via switches M8 and M9 Switch M8 includes a first S/D terminal connected to terminal BLB, a second S/D terminal connected to terminal INV, and a gate connectable to receive a control signal PBLB. Switch M9 includes a first S/D terminal connected to terminal BL, a second S/D terminal connected to terminal INV, and a gate connectable to receive a control signal PBL.

Bias voltage application unit 310 applies a bit line bias voltage to a selected cell during a programming operation based on a determination result provided by one-side latch 306 and both-side latch 308. Bias voltage application unit 310 includes switches M18 and M19 that are P-type metal oxide semiconductor (PMOS) transistors connected in series between a first voltage source terminal 311 and a terminal D. First voltage source terminal 311 is connectable to receive a system voltage $V_{DD}$ (first bias voltage level). Switch M18 includes a first S/D terminal connectable to receive voltage $V_{DD}$, a second S/D terminal connected to a first S/D terminal of switch M19, and a gate connectable to receive the voltage $V_{OLB}$ at terminal OLB of one-side latch 306. Switch M19 includes the first S/D terminal connected to the second S/D terminal of switch M18, a second S/D terminal connected to terminal D, and a gate connectable to receive the voltage $V_{BLB}$ at terminal BLB of both-side latch 308.

Bias voltage application unit 310 also includes switches M20 and M21 that are NMOS transistors connected in series between a second voltage source terminal 312 and terminal D. Second voltage source terminal 312 is connectable to ground GND (second bias voltage level). Switch M20 includes a first S/D terminal connected to ground GND, a second S/D terminal connected to a first S/D terminal of switch M21, and a gate connectable to receive the voltage $V_{OLB}$ at terminal OLB of one-side latch 306. Switch M21 includes the first S/D terminal connected to the second S/D terminal of switch M20, a second S/D terminal connected to terminal D, and a gate connectable to receive the voltage $V_{BLB}$ at terminal BLB of both-side latch 308.

Bias voltage application unit 310 also includes switches M22 and M23 that are NMOS transistors connected in series between a third voltage source terminal 313 and terminal D. Third voltage source terminal 313 is connectable to receive a voltage $V_H$ (third bias voltage level), which is lower than voltage $V_{DD}$. Switch M22 includes a first S/D terminal connectable to receive voltage $V_H$, a second S/D terminal connected to a first S/D terminal of switch M23, and a gate connectable to receive the voltage $V_{OLB}$ at terminal OLB of one-side latch 306. Switch M23 includes the first S/D terminal connected to the second S/D/ terminal of switch M22, a second S/D terminal connected to terminal D, and a gate connectable to receive the voltage $V_{BLB}$ at terminal BLB of both-side latch 308.

Bias voltage application unit 310 further includes switches M24 and M25 that are NMOS transistors connected in series between a fourth voltage source terminal 314 and terminal D. Fourth voltage source terminal 314 is connectable to receive a voltage $V_L$ (fourth bias voltage level), which is lower than voltage $V_H$. That is, $V_L < V_H < V_{DD}$. Switch M24 includes a first S/D terminal connectable to receive voltage $V_L$, a second S/D terminal connected to a first S/D terminal of switch M25, and a gate connectable to receive the voltage $V_{OL}$ at terminal OL of one-side latch 306. Switch M25 includes the first S/D terminal connected to the second S/D terminal of switch M24, a second S/D terminal connected to terminal D, and a gate connectable to receive the voltage $V_{BL}$ at terminal BL of both-side latch 308.

Switch M1 includes a first S/D terminal connectable to receive a control signal VPG or be connected to ground, a second S/D terminal connected to terminal INV, and a gate connectable to receive a control signal SET. Switch M2 includes a first S/D terminal connected to terminal D, a second S/D terminal connected to terminal INV, and a gate connectable to receive a control signal PGM. Switch M3 includes a first S/D terminal connected to terminal INV, a second S/D terminal connected to a terminal SEN, and a gate connectable to receive a control signal NPASS. Switch M4 includes a first S/D terminal connected to a common line (dashed line illustrated in FIG. 3), which is (not shown), a second S/D terminal connectable to receive a verify voltage $V_{vfy}$, and a gate connected to terminal INV. The common line is connected to switch M4 of all of page buffers P0-P3. If any one of page buffers P0-P3 has a relatively high voltage at its terminal INV, the voltage at the common line will be relatively low, and thus the voltage at terminal INV of other page buffers will be relatively low. Switch M5 includes a first S/D terminal connected to terminal SEN, a second S/D terminal connected to bit line BL1 of memory array 100, and a gate connectable to receive a control signal BLC. Switch M16 includes a first S/D terminal connected to terminal INV, a second S/D terminal connected to a terminal E, and a gate connected to terminal SEN. Switch M17 includes a first S/D terminal connected to a terminal E, a second S/D terminal connected to a system voltage $V_{SS}$, and a gate connectable to receive a control signal STBN.

Terminal INV of page buffer P1 is connected to even switch SE1 disposed at the right side of page buffer P1. Even switch SE1 is an NMOS transistor including a first terminal connected to terminal INV of page buffer P1, a second terminal connected to a terminal INV of page buffer P2 (not shown), and a gate electrode connectable to receive a control signal SE. Although not illustrated in FIG. 3, terminal INV of page buffer P1 is also connected to odd switch SO1 disposed at the left side of page buffer P1. Odd switch SO1 is also an NMOS transistor including a first terminal connected to a terminal INV of page buffer P0 (not shown), a second terminal connected to terminal INV of page buffer P1, and a gate electrode connectable to receive a control signal SO.

Page Buffer Operation

Figure 4:
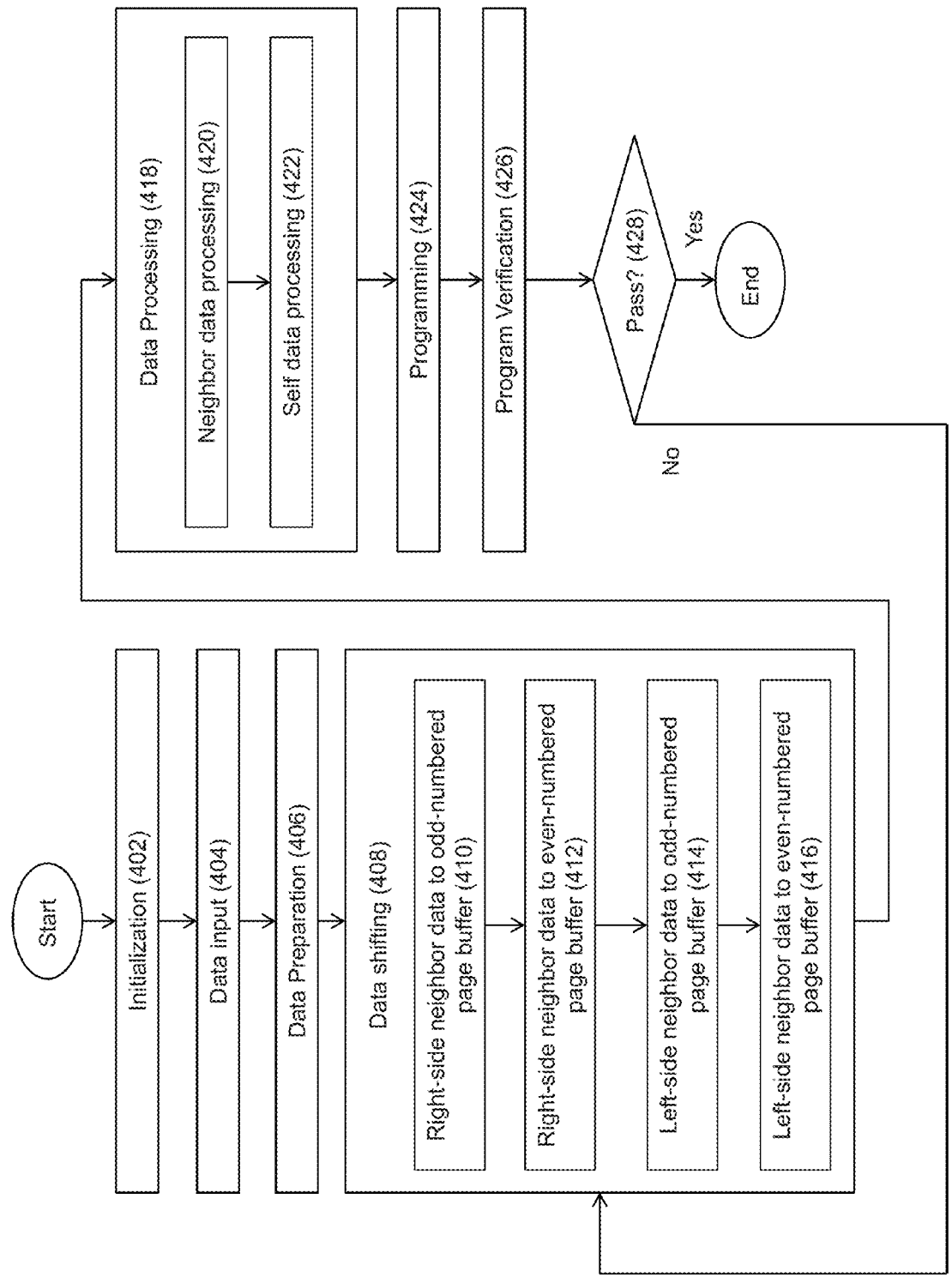
FIG. 4 is a flow chart of a process of operating page buffers in a page buffer circuit, according to an illustrated embodiment.

The operation of page buffers P0-P3 will be explained with references to FIGS. 4-34. FIG. 4 is a flow chart of a process 400 of operating page buffers P0-P3 by controller 150, according to an illustrated embodiment. Referring to FIG. 4, first, controller 150 performs an initialization operation on page buffer circuit 110 to initialize each one of page buffers P0-P3 (step 402). Controller 150 performs a data input operation on page buffer circuit 110 to input data to each one of page buffers P0-P3 (step 404). Controller 150 then performs a data preparation operation on page buffer circuit 110 to prepare the data to be shifted (step 406).

Controller 150 then performs a data shifting operation on page buffer circuit 110 to shift, to each one of page buffers P0-P3, data from their respective right-side neighbor and from their respective left-side neighbor (step 408). The data shifting operation includes first through fourth steps 410-416. In the first step, controller 150 controls page buffer circuit 110 to shift data of right-side neighbor page buffer P2 to odd-number page buffer P1 (step 410). In the second step, controller 150 controls page buffer circuit 110 to shift data of right-side neighbor page buffer P1 to even page buffer P0, and shift data of right-side neighbor page buffer P3 to even page buffer P2 (step 412). In the third step, controller 150 controls page buffer circuit 110 to shift data of left-side neighbor page buffer P0 to odd page buffer P1, and shift data of left-side neighbor page buffer P2 to odd page buffer P3 (step 414). In the fourth step, controller 150 controls page buffer circuit 110 to shift data of left-side neighbor page buffer P1 to even-number page buffer P2 (step 416).

After the data shifting operation, controller 150 performs a data processing operation on page buffer circuit 110, to enable each one of page buffers P1 and P2 to process neighbor data and its own input data for programming (step 418). The data processing operation includes a first step 420 of processing neighbor data, and a second step 422 of processing self data. During the first step, controller 150 enables each one of page buffers P1 and P2 to process the data shifted from the neighboring page buffers to determine programming status of the neighboring cells (step 420). During the second step, controller 150 enables each one of page buffers P1 and P2 to process its own input data (step 422). Each one of edge page buffers P0 and P3 also processes its neighbor's data, but uses dummy latch data for its missing neighbor.

After the data processing operation at step 418, controller 150 performs a programming operation on page buffer circuit 110, to program the input data stored in page buffers P0-P3 to their respectively corresponding memory cells (step 424). Then, controller 150 performs a program-verification operation on page buffer circuit 110 and memory array 100 to determine if the selected cells have been programmed to their respective targeted level (step 426). Controller 150 then determines whether the program-verification operation passes or not (step 428). If the program-verification operation does not pass, i.e., one or more of the selected cells have not been programmed to their respective targeted levels, process 400 returns to step 408 to perform a data shifting operation. Otherwise, if the program-verification operation passes, i.e., all of the selected cells have been programmed to their respective targeted levels, process 400 stops.

Initialization

Figure 5:
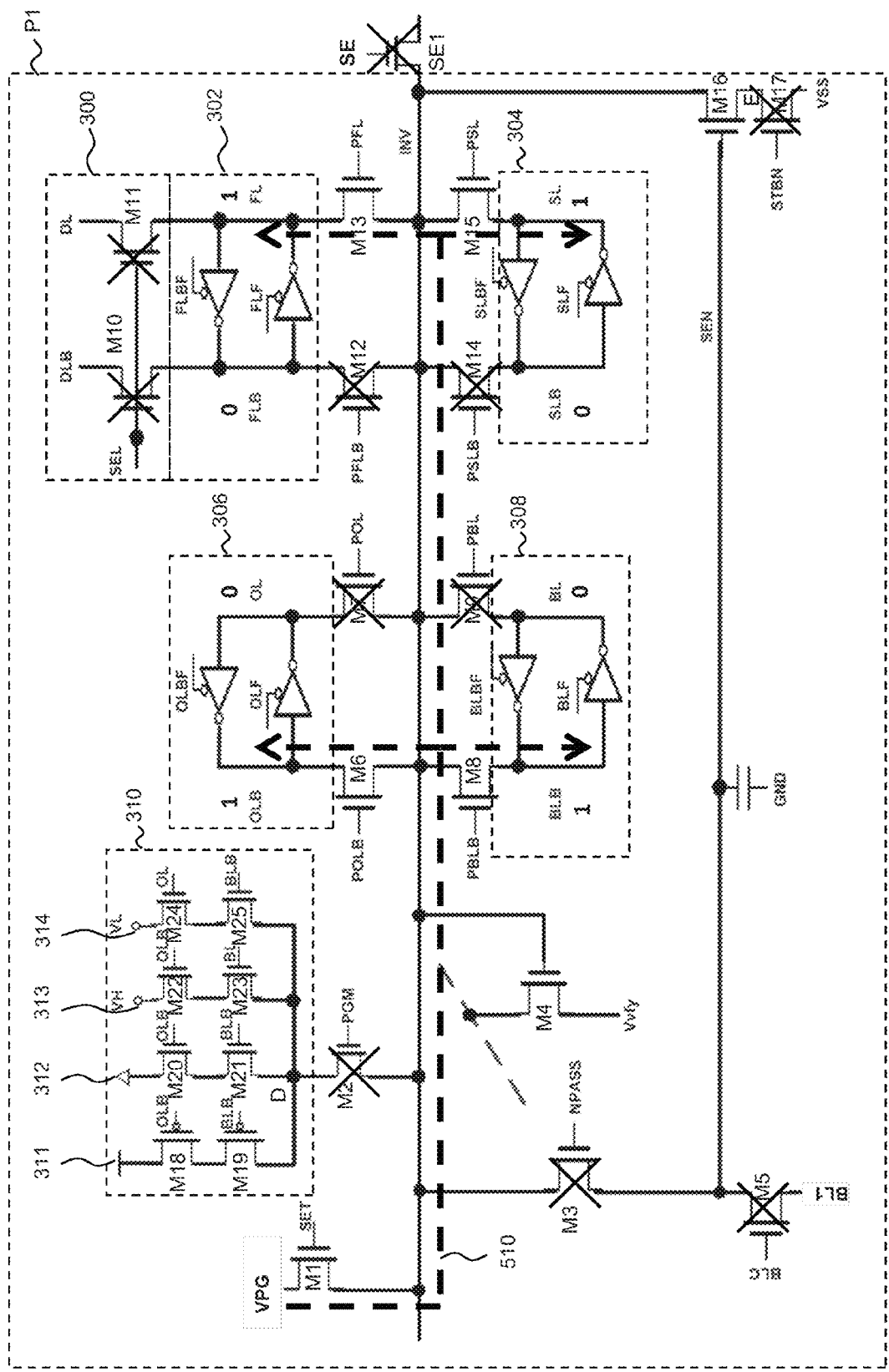
FIG. 5 is a circuit diagram of a page buffer during an initialization operation, according to an illustrated embodiment.

FIG. 5 is a circuit diagram of page buffer P1 during the initialization operation (step 402), according to an illustrated embodiment. The initialization operations of page buffers P0, P2, and P3 are similar to that of page buffer P1. Therefore, separate descriptions of the initialization operations of page buffers P0, P2, and P3 are not provided.

During the initialization operation of page buffer P1, controller 150 turns on switches M1, M6, M8, M13, and M15, by respectively applying control signals SET, POLB, PBLB, PFL, and PSL with a high level ("1") to the gates of these switches. Controller 150 turns off (represented by crosses "X" in FIG. 5) switches M2, M3, M5, M7, M9, M12, M14, and M17, by respectively applying control signals PGM, NPASS, BLC, POL, PBL, PFLB, PSLB, and STBN with a low level ("0") to the gates of these switches. Controller 150 also turns off switches M10 and M11 by applying control signal SEL with the low level ("0") to the gates of these switches. Controller 150 also turns off even switch SE1 located at the right side of page buffer P1 and odd switch SO1 located at the left side of page buffer P1 by respectively applying control signals SE and SO with the low level ("0") to the gates of these switches. The on/off status of each one of M4 and M16 depends on its gate bias, but does not affect the circuit operation.

At the same time, controller 150 applies a control signal VPG with the high level ("1") to the first terminal of switch M1. The signal is transferred via a path 510 represented by a broken line in FIG. 5. As a result, the voltages at terminal FL of first latch 302, terminal SL of second latch 304, terminal OLB of one-side latch 306, and terminal BLB of both-side latch 308 are reset to "1". Because the voltages at terminals FLB, SLB, OL, and BL are phase-inverse to the voltages at terminals FL, SL, OLB, and BLB, respectively, the voltages at terminals FLB, SLB, OL, and BL are reset to "0". Because switch M2 is turned off, the voltage at terminal D of bias voltage application unit 310 does not affect the voltage at terminal INV.

Data Input

Figure 6:
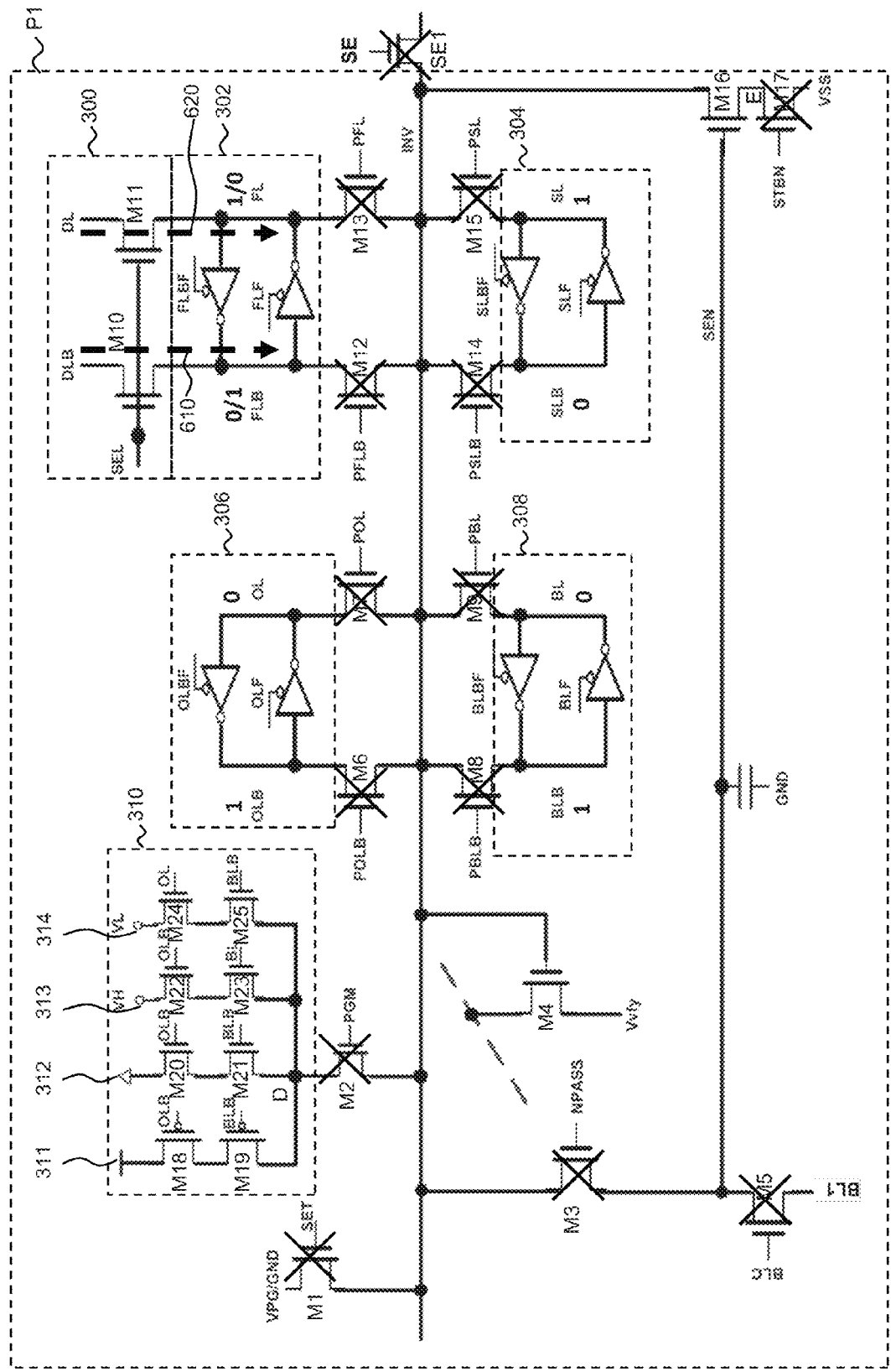
FIG. 6 is a circuit diagram of a page buffer during a data input operation, according to an illustrated embodiment.

FIG. 6 is a circuit diagram of page buffer P1 during the data input operation (step 404), according to an illustrated embodiment. The data input operations of page buffers P0, P2, and P3 are similar to that of page buffer P1. Therefore, separate descriptions of the data input operations of page buffers P0, P2, and P3 are not provided.

During the data input operation of page buffer P1, controller 150 turns on switches M10 and M11, by applying control signal SEL with the high level ("1") to the gates of these switches. Controller 150 turns off switches M1, M2, M3, M5, M6, M7, M8, M9, M12, M13, M14, M15, and M17, by respectively applying control signals SET, PGM, NPASS, BLC, POLB, POL, PBLB, PBL, PFLB, PFL, PSLB, PSL, and STBN with the low level ("0") to the gates of these switches. Controller 150 also turns off even switch SE1 and odd switch SO1, by respectively applying control signals SE and SO with the low level ("0") to the gates of these switches. The on/off status of each one of M4 and M16 depends on its gate bias, but does not affect the circuit operation.

At the same time, data input unit 300 receives data represented by data signals DL and DLB from the external data decoder (not illustrated in FIG. 6). The data can be either "1" or "0". The data is transferred via paths 610 and 620 to first latch 302. As a result, the data at terminal FL represented by voltage $V_{FL}$ is the same as voltage $V_{DL}$ of data signal DL, and the data at terminal FLB represented by voltage $V_{FLB}$ is the same as voltage $V_{DLB}$ of data signal DLB, which is phase-inverse to data signal DL. That is, when input data is "1", $V_{FL}$="1", and $V_{FLB}$="0"; and when input data is "0", $V_{FL}$="0", and $V_{FLB}$="1". At this time, the voltages at terminals OLB, BLB, and SL remain as "1", and the voltages at terminals OL, BL, and SLB remain as "0".

Data Preparation

Figure 7:
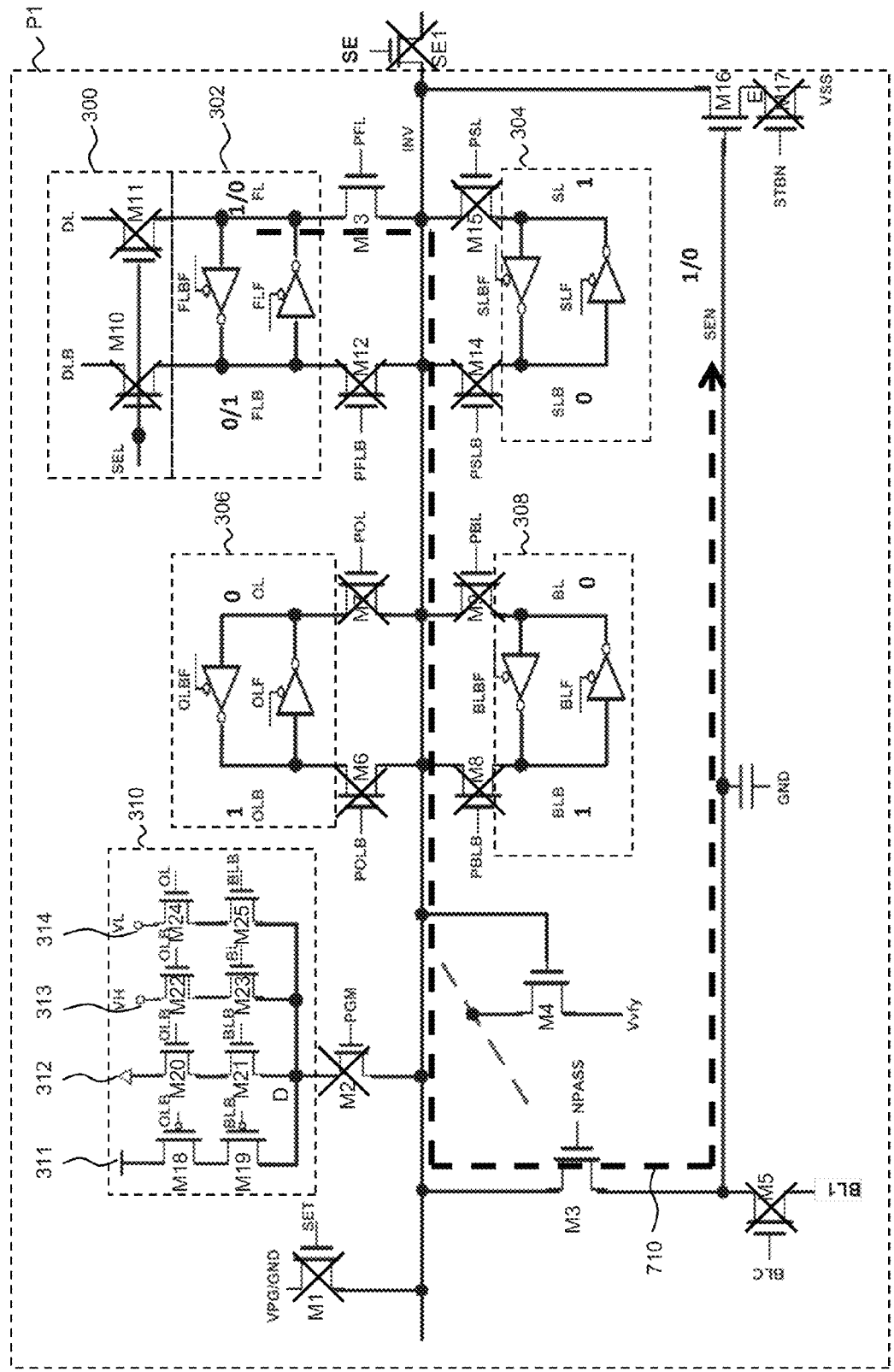
FIG. 7 is a circuit diagram of a page buffer during a data preparation operation, according to an illustrated embodiment.

FIG. 7 is a circuit diagram of page buffer P1 during the data preparation operation (step 406), according to an illustrated embodiment. The data preparation operation of page buffers P0, P2, and P3 is similar to that of page buffer P1. Therefore, separate description of the data preparation operation of page buffers P0, P2, and P3 is not provided.

During the data preparation operation of page buffer P1, controller 150 turns on switches M3 and M13 by respectively applying control signals NPASS and PFL with the high level ("1") to the gates of these switches. Controller 150 turns off switches M1, M2, M5, M6, M7, M8, M9, M10, M11, M12, M14, M15, and M17 by respectively applying control signals SET, PGM, BLC, POLB, POL, PBLB, PBL, SEL, SEL, PFLB, PSLB, PSL, and STBN with the low level ("0") to the gates of these switches. Controller 150 also turns off even switch SE1 and odd switch SO1, by respectively applying control signals SE and SO with the low level ("0") to the gates of these switches.

As a result, the data at terminal FL of first latch 302 is transferred to terminal SEN via a path 710. That is, when $V_{FL}$="1", $V_{SEN}$="1"; and when $V_{FL}$="0", $V_{SEN}$="0". At this time, the voltages at terminals OLB, BLB, and SL remain as "1", and the voltages at terminals OL, BL, and SLB remain as "0".

Data Shifting

Data of Right-side Neighbor Shifting to Odd Page Buffers

Figure 8:
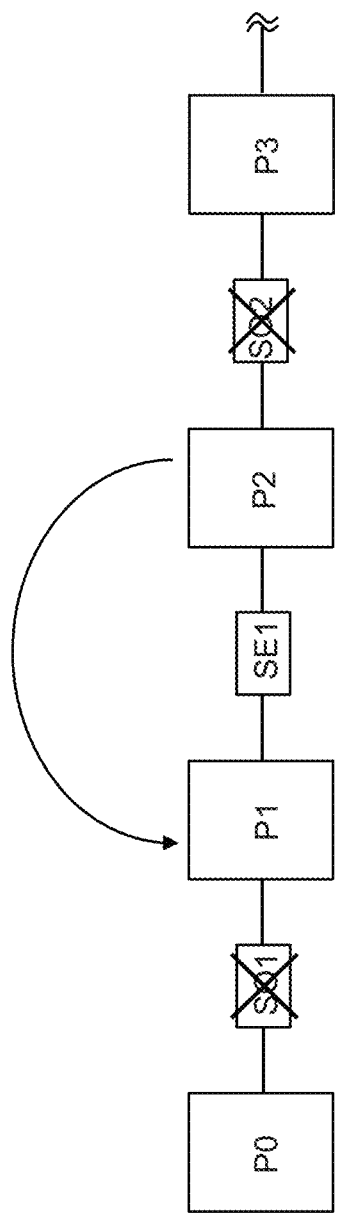
FIG. 8 is a diagram of page buffers in a page buffer circuit during a first step of a data shifting operation, according to an illustrated embodiment.

FIG. 8 is a diagram of page buffers P0-P3 in a first step of the data shifting operation (step 410), according to an illustrated embodiment. According to FIG. 8, controller 150 turns off odd switches SO1 and SO2, and turns on even switch SE1 to shift, to odd page buffer P1, data from its right-side neighbor, i.e., page buffer P2.

Figure 9:
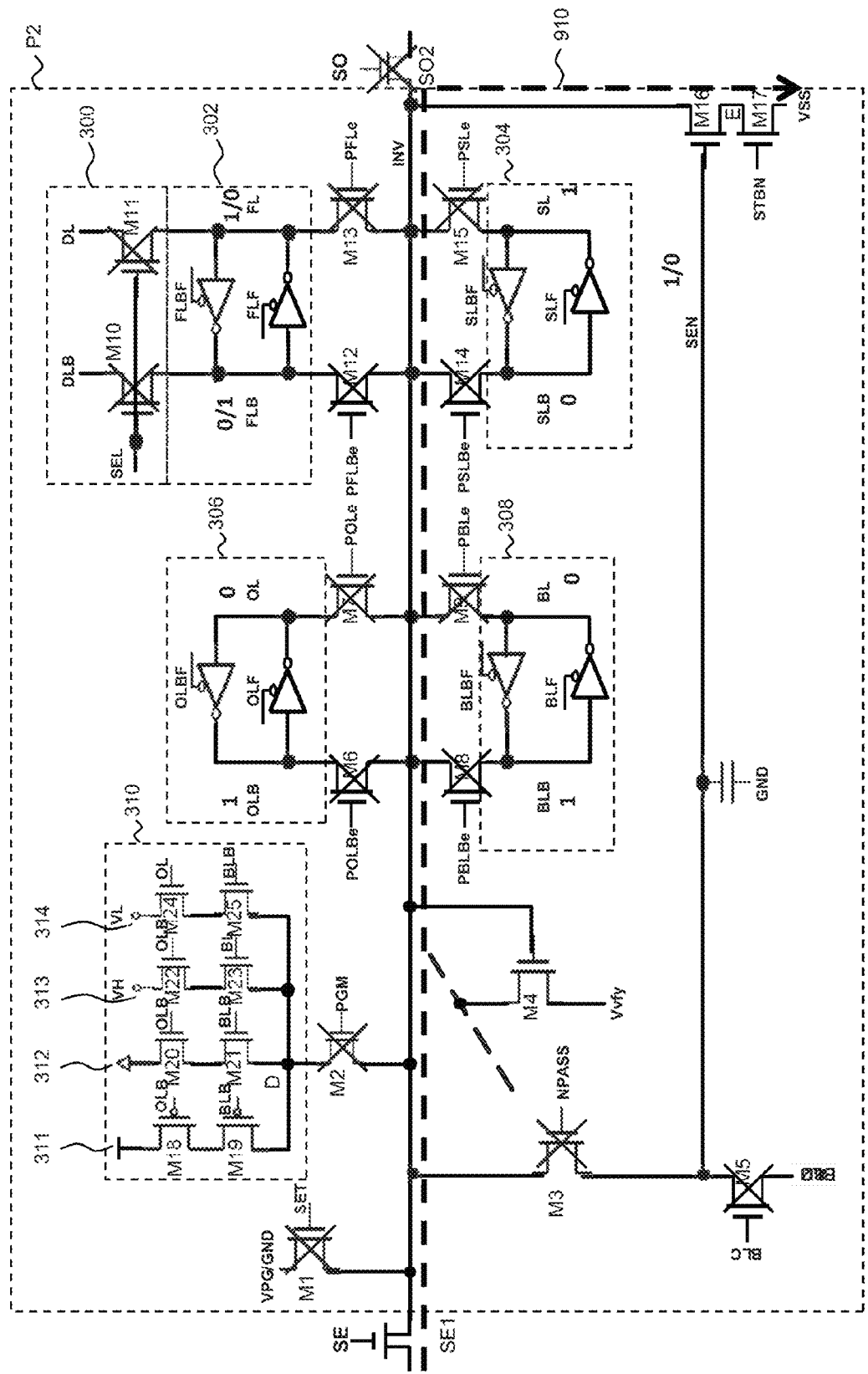
FIGS. 9 and 10 are circuit diagrams of two page buffers during the first step of the data shifting operation, according to an illustrated embodiment.
Figure 10:
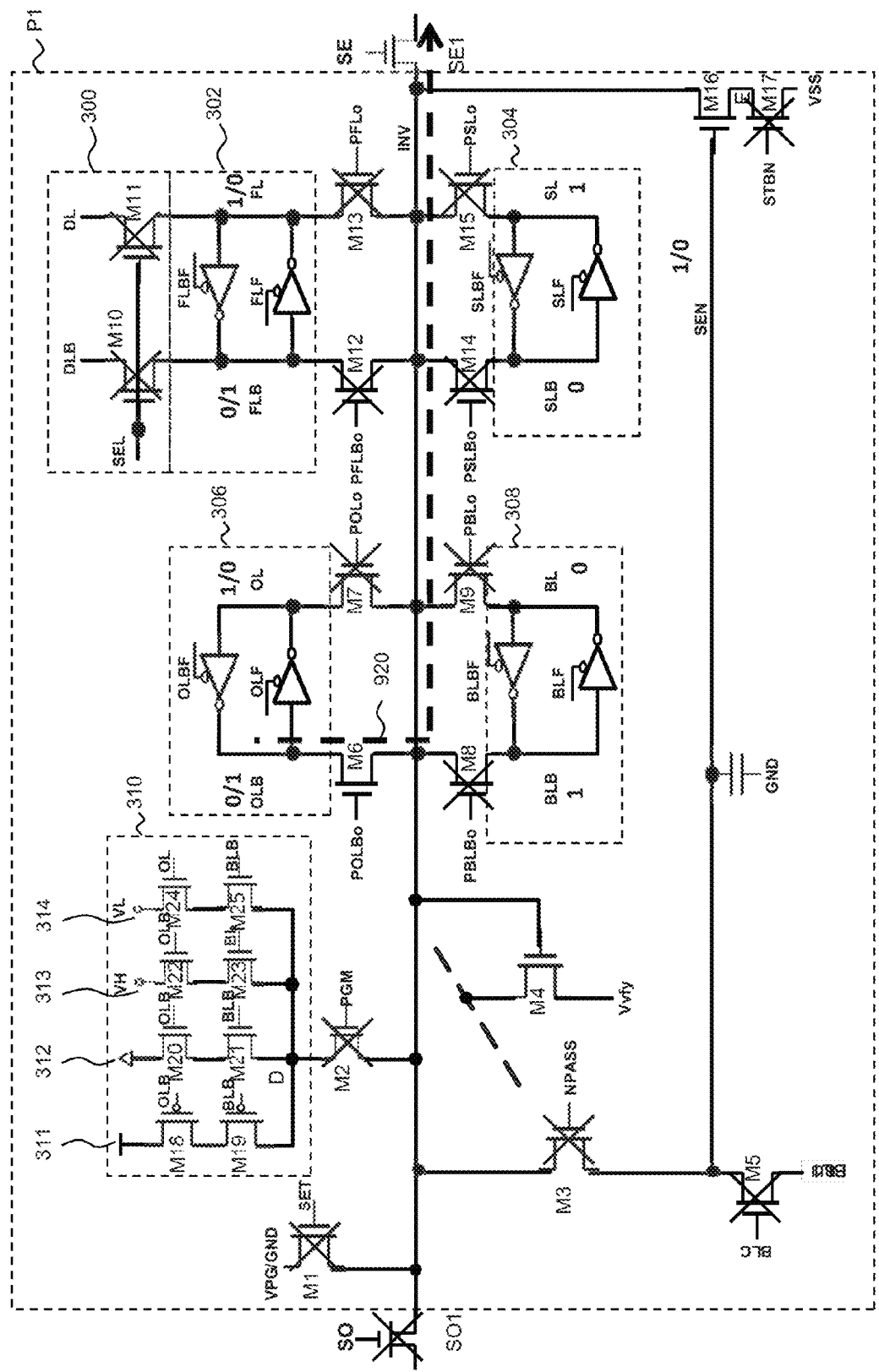

FIGS. 9 and 10 are circuit diagrams of page buffers P2 and P1, respectively, when the data of page buffer P2 shifts to page buffer P1, according to an illustrated embodiment.

Referring to FIG. 9, for page buffer P2, controller 150 turns on switches M17 and SE1 by respectively applying control signals STBN and SE with the high level ("1") to the gates of these switches. Controller 150 turns off switches M1, M2, M3, M5, M6, M7, M8, M9, M10, M11, M12, M13, M14, M15, 501, and SO2 by respectively applying control signals SET, PGM, NPASS, BLC, POLBe, POLe, PBLBe, PBLe, SEL, SEL, PFLBe, PFLe, PSLBe, PSLe, SO, and SO with the low level ("0") to the gates of these switches.

Switch M16 of page buffer P2 is turned on or off based on the data at terminal SEN of page buffer P2, represented by voltage $V_{SEN2}$. When the data at terminal SEN of page buffer P2 is "1", switch M16 is turned on. As a result, the voltage $V_{INV2}$ at terminal INV of page buffer P2 is pulled down by the system voltage $V_{SS}$ (e.g., ground), which is applied at the second terminal of switch M17, via a path 910. Voltage $V_{INV1}$ at terminal INV of page buffer P1 (not illustrated in FIG. 9), which is located at the left side of switch SE1, is also pulled down to "0" by the system voltage Vss, via path 910. That is, when $V_{SEN2}$="1", $V_{INV1}$="0". On the other hand, when the data at terminal SEN of page buffer P2 (represented by $V_{SEN2}$) is "0", switch M16 is turned off. As a result, voltage $V_{INV2}$ at terminal INV of page buffer P2 remains unchanged. Consequently, voltage $V_{INV1}$ at terminal INV of page buffer P1 remains unchanged.

Referring to FIG. 10, at the same time, for page buffer P1, controller 150 turns on switch M6 by applying a control signal POLBo with the high level ("1") to the gate of switch M6. Controller 150 turns off switches M1, M2, M3, M5, M7, M8, M9, M10, M11, M12, M13, M14, M15, and M17 by respectively applying control signals SET, PGM, NPASS, BLC, POLo, PBLBo, PBLo, SEL, SEL, PFLBo, PFLo, PSLBo, PSLo, and STBN with the low level ("0") to the gates of these switches. Odd switch SO1 remains turned off, and even switch SE1 remains turned on.

As explained previously, when the data at terminal SEN of page buffer P2 (represented by voltage $V_{SEN2}$) is "1", voltage $V_{INV1}$ at terminal INV of page buffer P1 is pulled down to "0" by the system voltage Vss via path 910. Voltage $V_{OLB}$ at terminal OLB of page buffer P1 is also pulled down to "0" by the system voltage $V_{SS}$ (e.g., ground), via a path 920. Because voltage $V_{OL1}$ at terminal OL is phase-inverse to voltage $V_{OLB1}$ at terminal OLB, $V_{OL1}$="1". That is, when $V_{SEN2}$="1", $V_{INV1}$="0", $V_{OLB1}$="0", $V_{OL1}$="1". On the other hand, when the data at terminal SEN of page buffer P2 (represented by voltage $V_{SEN2}$) is "0", voltage $V_{INV1}$ at terminal INV of page buffer P0 remains unchanged. Consequently, voltage $V_{OLB1}$ at terminal OLB of page buffer P1 remains unchanged, as its initialized voltage of "1". That is, when $V_{SEN2}$="0", $V_{OLB1}$="1", $V_{OL1}$="0".

$V_{SEN2}$ at terminal SEN of page buffer P2 represents the data at terminal FL of first latch 302 of page buffer P2, as illustrated in FIG. 7. Therefore, as a result of the first step of the data shifting operation, the data at terminal FL of first latch 302 of page buffer P2 is shifted to terminal OL of one-side latch 306 of page buffer P1. In other words, terminal OL of one-side latch 306 of page buffer P1 loads the data from terminal FL of first latch 302 of page buffer P2, which is the input data of page buffer P2.

Data of Right-side Neighbor Shifting to Even Page Buffer

Figure 11:
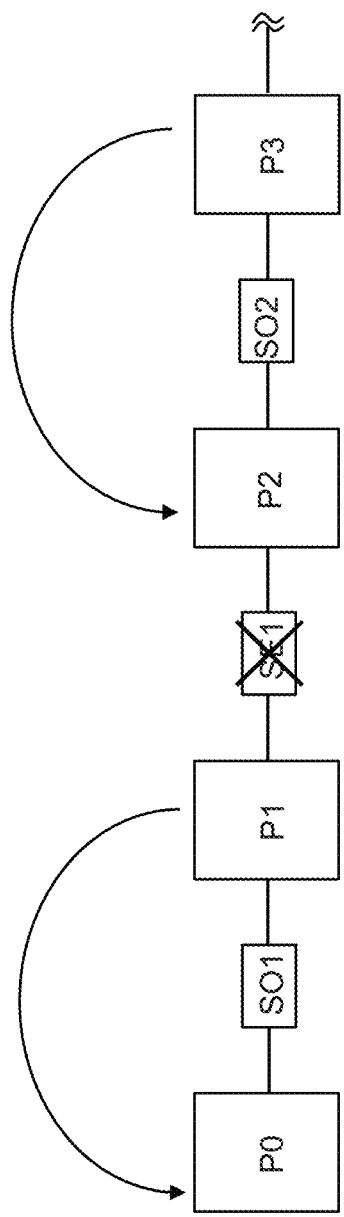
FIG. 11 is a diagram of page buffers in a page buffer circuit during a second step of the data shifting operation, according to an illustrated embodiment.

FIG. 11 is a diagram of page buffers P0-P3 in the second step of the data shifting operation (step 412), according to an illustrated embodiment. Referring to FIG. 11, controller 150 turns off even switch SE1, and turns on odd switches SO1 and SO2 to shift data, to even page buffers P0 and P2, from their respective right-side neighbors, i.e., page buffers P1 and P3. The operation of page buffers P0 and P1, and the operation of page buffers P2 and P3 in the second step are similar to the operation of page buffers P1 and P2 in the first step, described with reference to FIGS. 9 and 10, except that in the second step, even switch SE1 is turned off, and odd switches SO1 and SO2 are turned on. Therefore, separate descriptions of the operations of page buffers P0 and P1, and the operations of page buffers P2 and P3 in the second step are not provided.

Data of Left-side Neighbor Shifting to Odd Page Buffers

Figure 12:
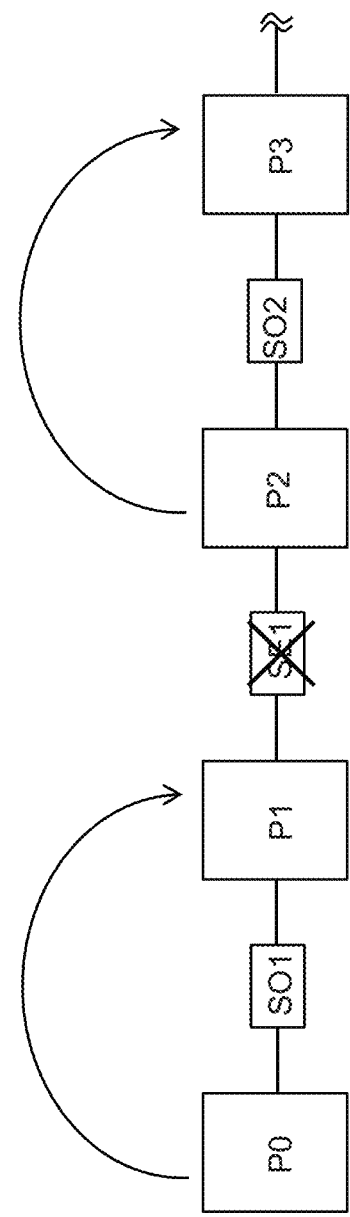
FIG. 12 is a diagram of page buffers in a page buffer circuit during a third step of the data shifting operation, according to an illustrated embodiment.

FIG. 12 is a diagram of page buffers P0-P3 in the third step of the data shifting operation (step 414), according to an illustrated embodiment. According to FIG. 12, controller 150 turns off even switch SE1, and turns on odd switches SO1 and SO2 to shift data, to odd page buffers P1 and P3, from their respective left-side neighbors, i.e., page buffers P0 and P2.

Figure 13:
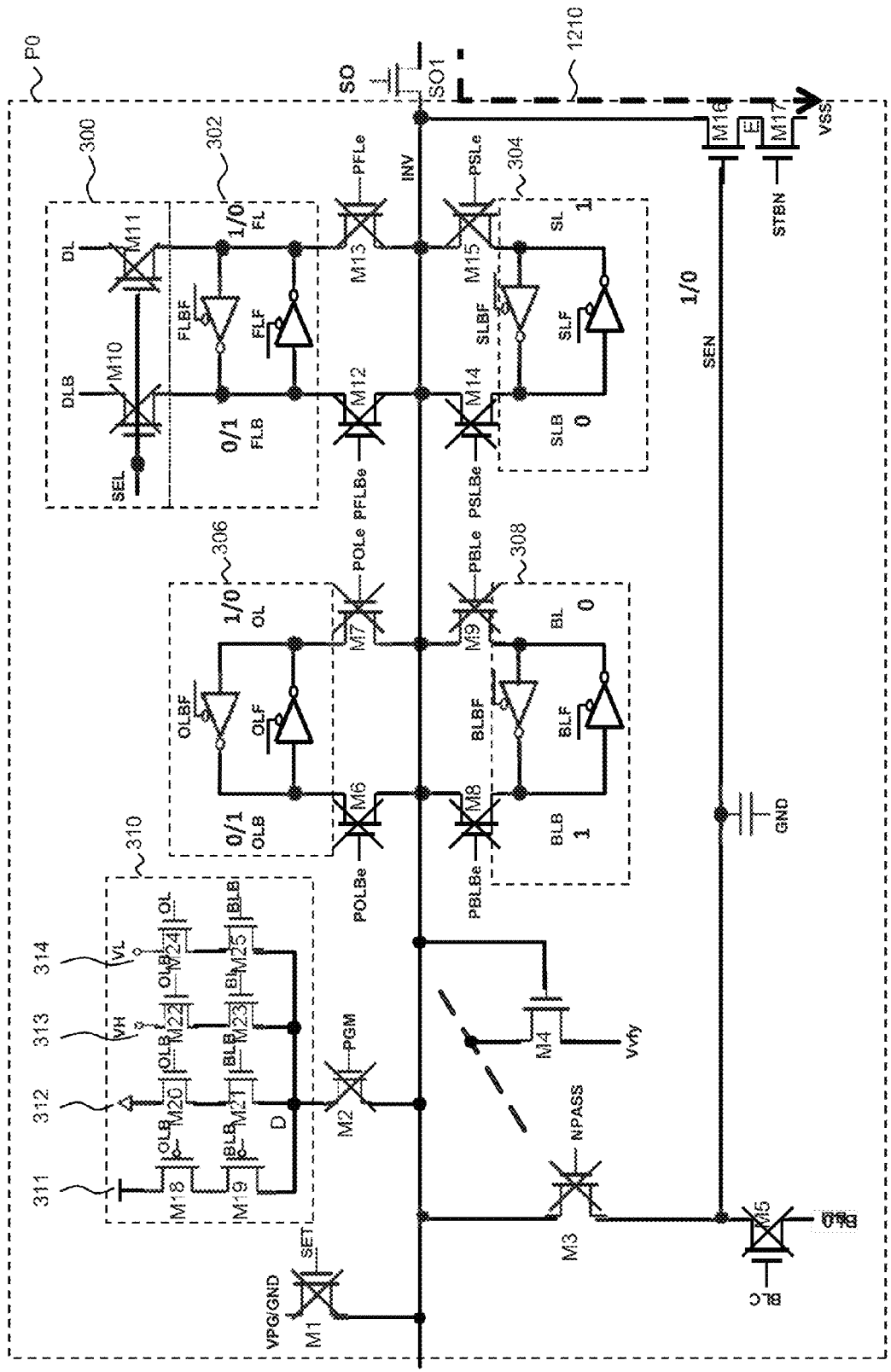
FIGS. 13 and 14 are circuit diagrams of two page buffers during the third step of the data shifting operation, according to an illustrated embodiment.
Figure 14:
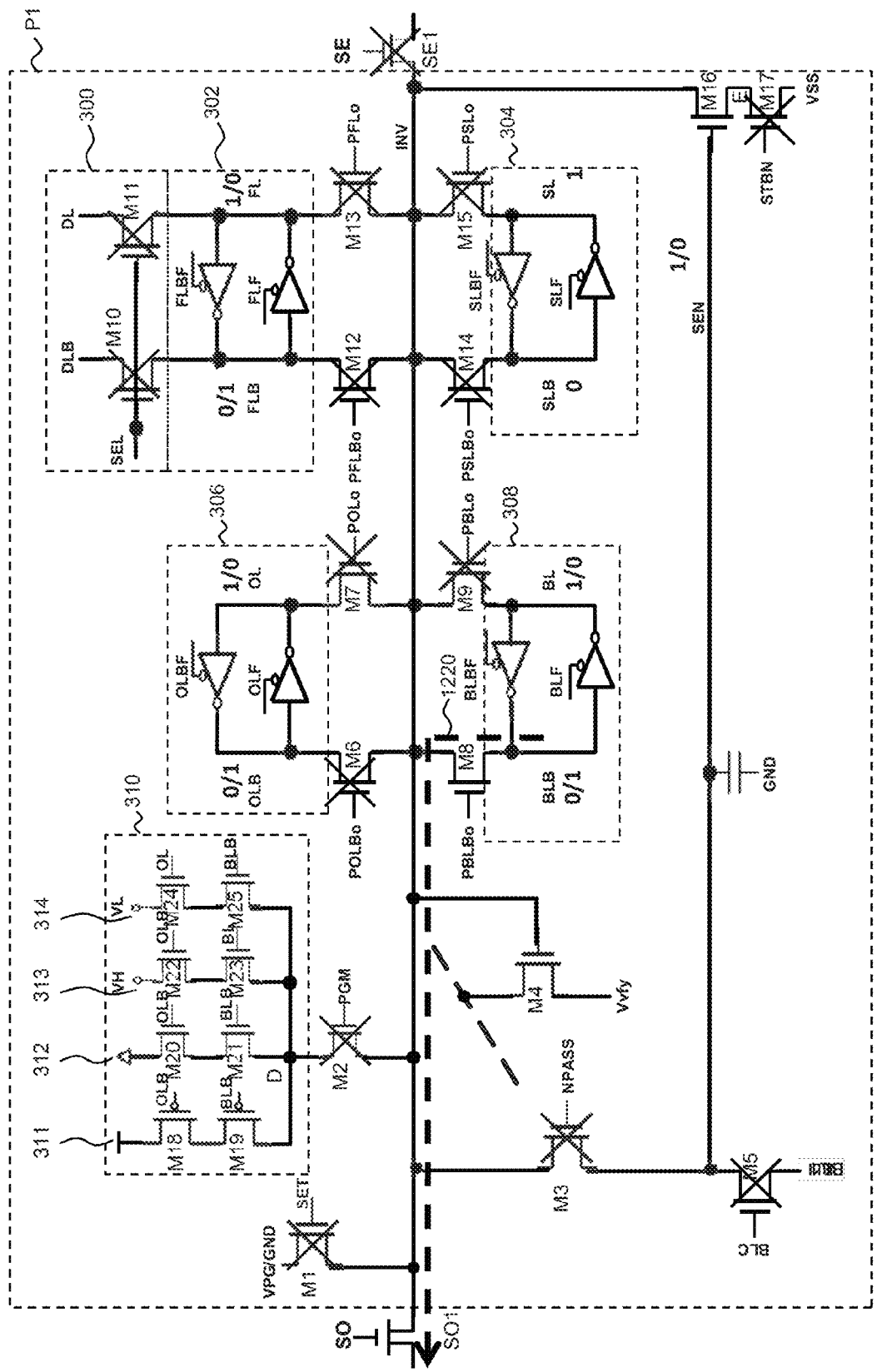

FIGS. 13 and 14 are circuit diagrams of page buffers P0 and P1, respectively, when the data of page buffer P0 shifts to page buffer P1, according to an illustrated embodiment. The operations of page buffers P2 and P3 in the third step of the data shifting operation are similar to that of pages P0 and P1 in the third step. Therefore, separation descriptions of the operations of page buffers P2 and P3 in the third step of the data shifting operation are not provided.

Referring to FIG. 13, for page buffer P0, controller 150 turns on switches M17 and SO1 by respectively applying control signals STBN and SO with the high level ("1") to the gates of these switches. Controller 150 turns off switches M1, M2, M3, M5, M6, M7, M8, M9, M10, M11, M12, M13, M14, and M15 by respectively applying control signals SET, PGM, NPASS, BLC, POLBe, POLe, PBLBe, PBLe, SEL, SEL, PFLBe, PFLe, PSLBe, and PSLe with the low level ("0") to the gates of these switches.

Switch M16 of page buffer P0 is turned on or off based on the data at terminal SEN of page buffer P0, represented by voltage $V_{SEN0}$. When the data at terminal SEN of page buffer P0 is "1", switch M16 is turned on. As a result, voltage $V_{INV10}$ at terminal INV of page buffer P0 is pulled down to "0" by the system voltage $V_{SS}$ (e.g., ground), which is applied at the second terminal of switch M17, via a path 1210. Voltage $V_{INV1}$ at terminal INV of page buffer P1 (not illustrated in FIG. 13), which is located at the right side of switch SO1, is also pulled down to "0" by the system voltage Vss, via path 1210. That is, when $V_{SEN0}$="1", $V_{INV1}$="0" On the other hand, when the data at terminal SEN of page buffer P0 (represented by voltage $V_{SEN0}$) is "0", switch M16 is turned off. As a result, voltage $V_{INV0}$ at terminal INV of page buffer P0 remains unchanged. Consequently, voltage $V_{INV1}$ at terminal INV of page buffer P1 remains unchanged.

Referring to FIG. 14, at the same time, for page buffer P1, controller 150 turns on switch M8 by applying a control signal PBLB with the high level ("1") to the gate of switch M8. Controller 150 turns off switches M1, M2, M3, M5, M6, M7, M9, M10, M11, M12, M13, M14, M15, M17, and SE1 by respectively applying control signals SET, PGM, NPASS, BLC, POLBo, POLo, PBLo, SEL, SEL, PFLBo, PFLo, PFLBo, PSLo, STBN, and SE with the low level ("0") to the gates of these switches. Even switch SO1 remains turned on.

As explained previously, when the data at terminal SEN of page buffer P0 (represented by voltage $V_{SEN0}$) is "1", voltage $V_{INv1}$ at terminal INV of page buffer P1 is pulled down to "0" by the system voltage Vss via path 1210. Voltage $V_{BLB1}$ at terminal BLB of page buffer P1 is also pulled down to "0" by the system voltage $V_{SS}$ (e.g., ground), via a path 1220. Voltage $V_{BL1}$ at terminal BL is phase-inverse to voltage $V_{BLB1}$ at terminal BLB, $V_{BL1}$="1". That is, when $V_{SEN0}$="1", $V_{BLB2}$="0", $V_{BL2}$="1". On the other hand, when the data at terminal SEN of page buffer P0 (which is represented by voltage $V_{SEN0}$) is "0", voltage $V_{INV1}$ at terminal INV of page buffer P1 remains unchanged. Consequently, voltage $V_{BLB1}$ at terminal BLB of page buffer P1 remains unchanged, as its initialized voltage of "1". Voltage $V_{BL1}$ at terminal BL is phase-inverse to voltage $V_{BLB1}$ at terminal BLB, $V_{BL1}$="0". That is, when $V_{SEN0}$="0", $V_{BLB1}$="1", $V_{BL1}$="0".

$V_{SEN0}$ at terminal SEN of page buffer P0 represents the data at terminal FL of first latch 302 of page buffer P0, as illustrated in FIG. 7. Therefore, as a result of the third step of the data shifting operation, the data at terminal FL of first latch 302 of page buffer P0 is shifted to terminal BL of both-side latch 308 of page buffer P1. In other words, terminal BL of both-side latch 308 of page buffer P1 loads the data from terminal FL of first latch 302 of page buffer P0, which is the input data of page buffer P0.

Data of Left-side Neighbor Shifting to Even Page Buffer

Figure 15:
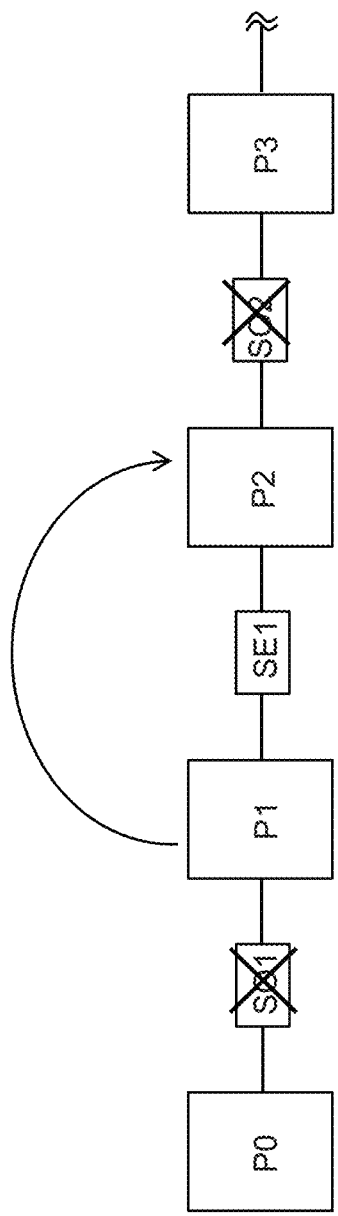
FIG. 15 is a diagram of page buffers in a page buffer circuit during a fourth step of the data shifting operation, according to an illustrated embodiment.

FIG. 15 is a diagram of page buffers P0-P3 in the fourth step of the data shifting operation (step 416), according to an illustrated embodiment. Referring to FIG. 15, controller 150 turns off odd switches SO1 and SO2, and turns on even switch SE1 to shift data, to even page buffer P2, from its left-side neighbor, i.e., page buffer P1. The operations of page buffers P1 and P2 in the fourth step, are similar to the operations of page buffers P0 and P1 in the third step, described with reference to FIGS. 13 and 14, except that in the fourth step, odd switches SO1 and SO2 are turned off, and even switches SE1 is turned on. Therefore, separate descriptions of the operations of page buffers P1 and P2 in the fourth step are not provided.

Data Processing

Neighbor Data Processing

FIGS. 16-21 are circuit diagrams of page buffer P1 during the neighbor data processing operation (step 420), according to an illustrated embodiment. The neighbor data processing operation of page buffer P2 is similar to that of page buffer P1. Therefore, separate description of the neighbor data processing operation of page buffer P2 is not provided.

As explained previously, after the data shifting operation and before the neighbor data processing operation, the data at terminal OL of page buffer P1 represents the input data of its right-side neighbor, i.e., page buffer P2; and the data at terminal BL of page buffer P1 represents the input data of its left-side neighbor, i.e., page buffer P0. Therefore, there are four possible combinations of data at terminals OL and BL. A first possible combination is $V_{OL}$="1", $V_{BL}$="1", indicating that the input data in page buffer P2 is "1", and the input data in page buffer P0 is "1". As used herein, the input data of "1" in a page buffer means a memory cell corresponding to that page buffer will not be programmed, i.e., will be program inhibited. Correspondingly, the input data of "0" in a page buffer means a memory cell corresponding to that page buffer will be programmed, i.e., will not be program inhibited. Accordingly, the first possible combination of $V_{OL}$="1" and $V_{BL}$="1" indicates that both of cell C corresponding to page buffer P2 and cell B corresponding to page buffer P0 illustrated in FIG. 1 will be program inhibited. A second possible combination is $V_{OL}$="1", $V_{BL}$="0", indicating that the input data in page buffer P2 is "1", and the input data in page buffer P0 is "0"; that is, cell C corresponding to page buffer P2 will be program inhibited, and cell B corresponding to page buffer P0 will not be program inhibited. A third possible combination is $V_{OL}$="0", $V_{BL}$="0", indicating that the input data in page buffer P2 is "0", and the input data in page buffer P0 is "0"; that is, both cell C corresponding to page buffer P2 and cell B corresponding to page buffer P0 will not be program inhibited. A fourth possible combination is $V_{OL}$="0", $V_{BL}$="1", indicating that the input data in page buffer P2 is "0", and the input data in page buffer P0 is "1"; that is, cell C corresponding to page buffer P2 will not be program inhibited and cell B corresponding to page buffer P0 will be program inhibited. In the following description, the four possible combinations of input data will be labeled together for $V_{OL}$, $V_{OLB}$, $V_{BL}$, and $V_{BLB}$. For example, $V_{OL}$="1", "1", "0", or "0", $V_{OLV}$="0", "0", "1", or "1", $V_{BL}$="1", "0", "0", or "1", and $V_{BLB}$="0", "1", "1", or "0", as labeled in FIG. 16.

Figure 16:
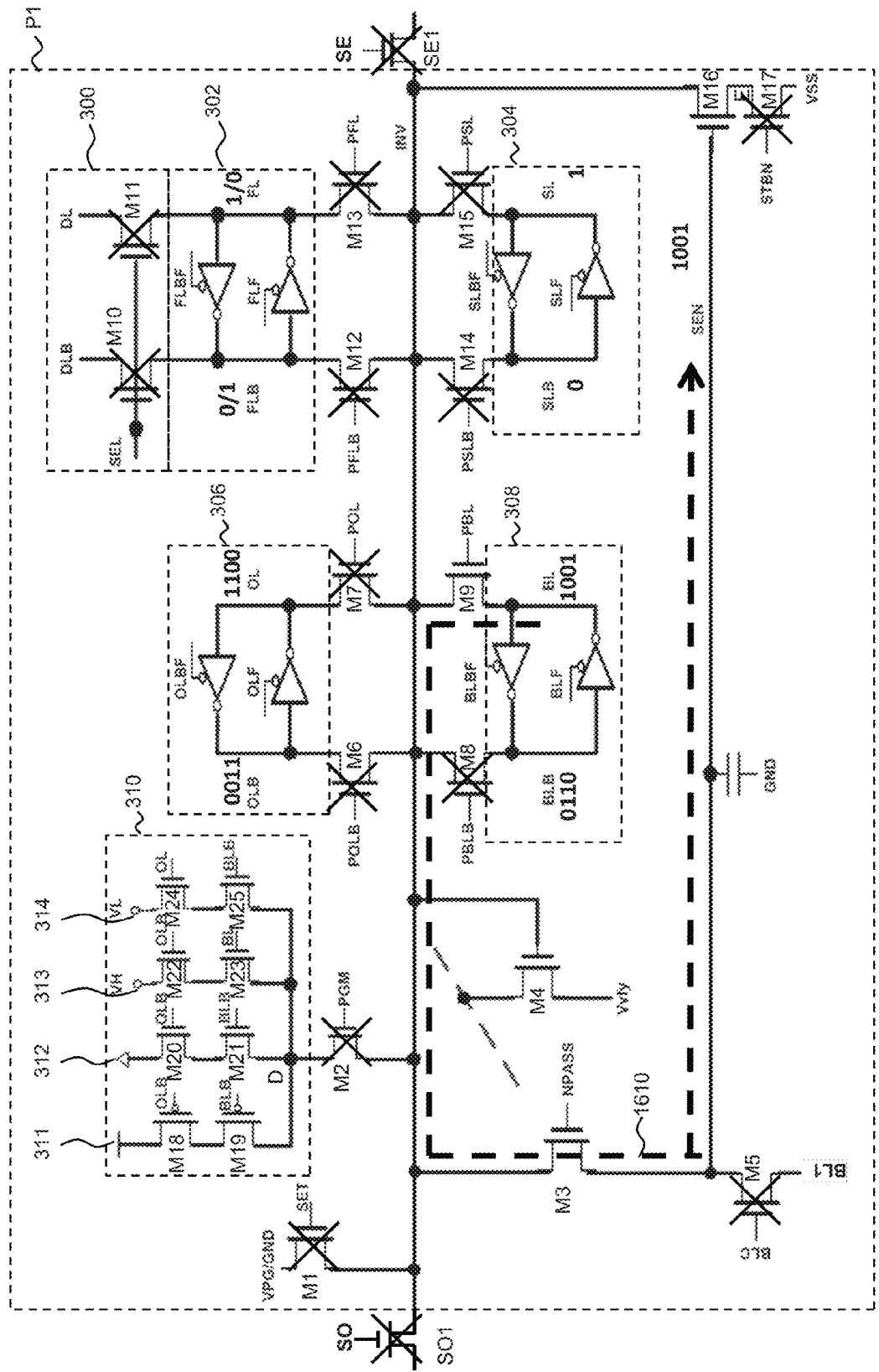
FIGS. 16-21 are circuit diagrams of a page buffer during a neighbor data processing operation, according to an illustrated embodiment.

Referring to FIG. 16, first, controller 150 turns on switches M3 and M9 by respectively applying control signals NPASS and PBL with the high level ("1") to the gates of these switches. Controller 150 turns off switches M1, M2, M5, M6, M7, M8, M10, M11, M12, M13, M14, M15, M17, SO1, and SE1 by respectively applying control signals SET, PGM, BLC, POLB, POL, PBLB, SEL, SEL, PFLB, PFL, PSLB, PSL, STBN, SO, and SE with the low level ("0") to the gates of these switches. The on/off status of M4 depends on its gate bias, but does not affect the circuit operation.

As a result, the data at terminal BL of both-side latch 308 is transferred to terminal SEN via a path 1610. That is, when $V_{BL}$="1", "0", "0", or "1", $V_{SEN}$="1", "0", "0", or "1", respectively. At this time, the data at terminals OLB, OL, BLB, BL, FLB, FL, SLB, and SL remain unchanged.

Figure 17:
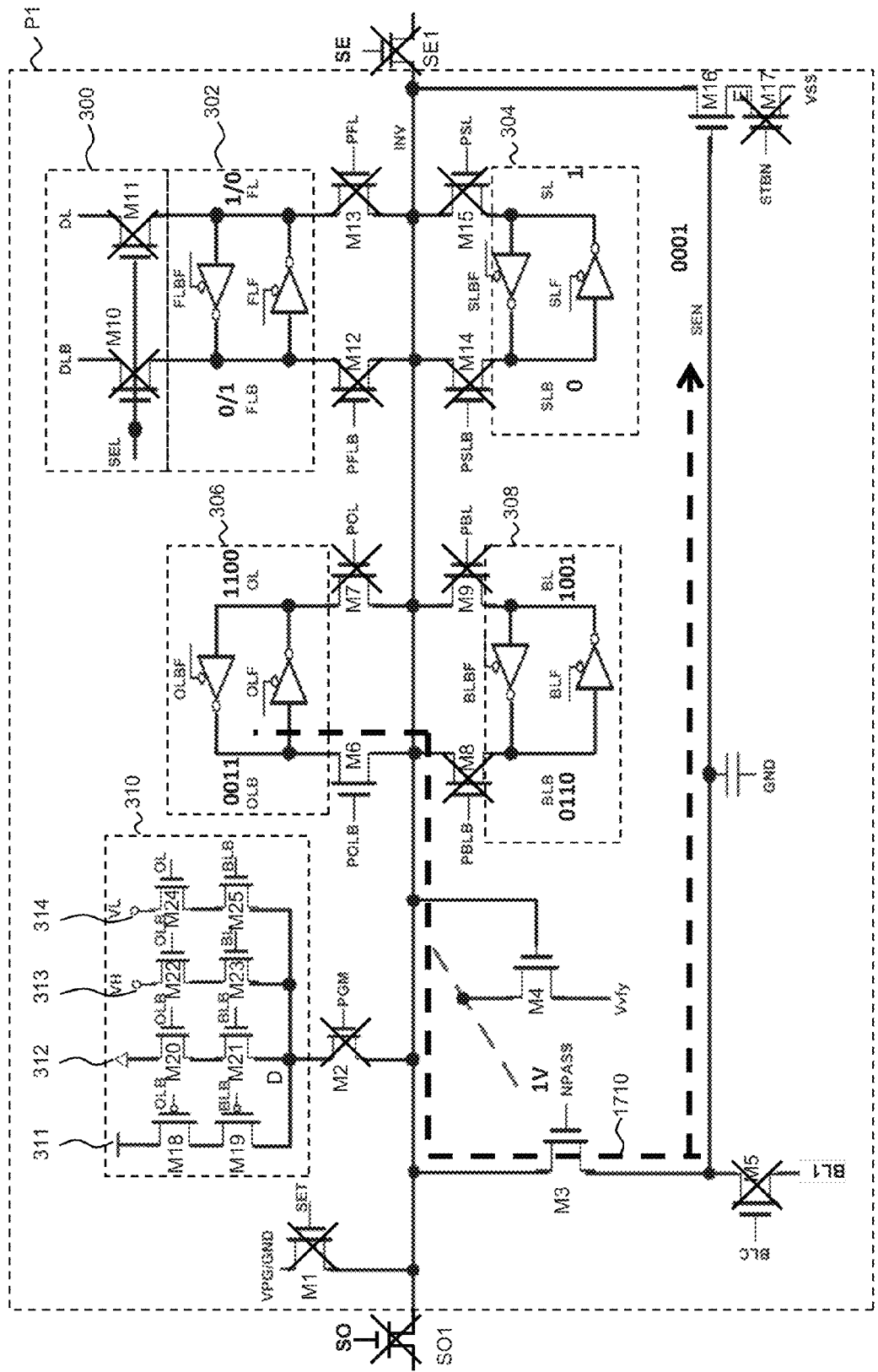

Referring to FIG. 17, controller 150 turns on switch M6 by applying a control signal POLB with the high level ("1") to the gate thereof. Controller 150 turns off switches M1, M2, M5, M7, M8, M9, M10, M11, M12, M13, M14, M15, M17, SO1, and SE1 by respectively applying control signals SET, PGM, BLC, POL, PBLB, PBL, SEL, SEL, PFLB, PFL, PSLB, PSL, STBN, SO, and SE with the low level ("0") to the gates of these switches. Controller 150 also sets the control signal NPASS applied at the gate of switch M3 with a predetermined voltage level such as, for example, 1V, such that only data of "0" can pass through switch M3, while data of "1" cannot pass through switch M3.

As a result, when the data at terminal OLB is "0", the data "0" is transferred via a path 1710 to terminal SEN. On the other hand, when the data at terminal OLB is "1", the data at terminal SEN remains unchanged, as previously transferred from terminal BLB. That is, when $V_{OLB}$="0", "0", "1", or "1", $V_{SEN}$="0", "0", "0", or "1", respectively. At this time, the data at terminals OLB, OL, BLB, BL, FLB, FL, SLB, and SL remain unchanged.

Figure 18:
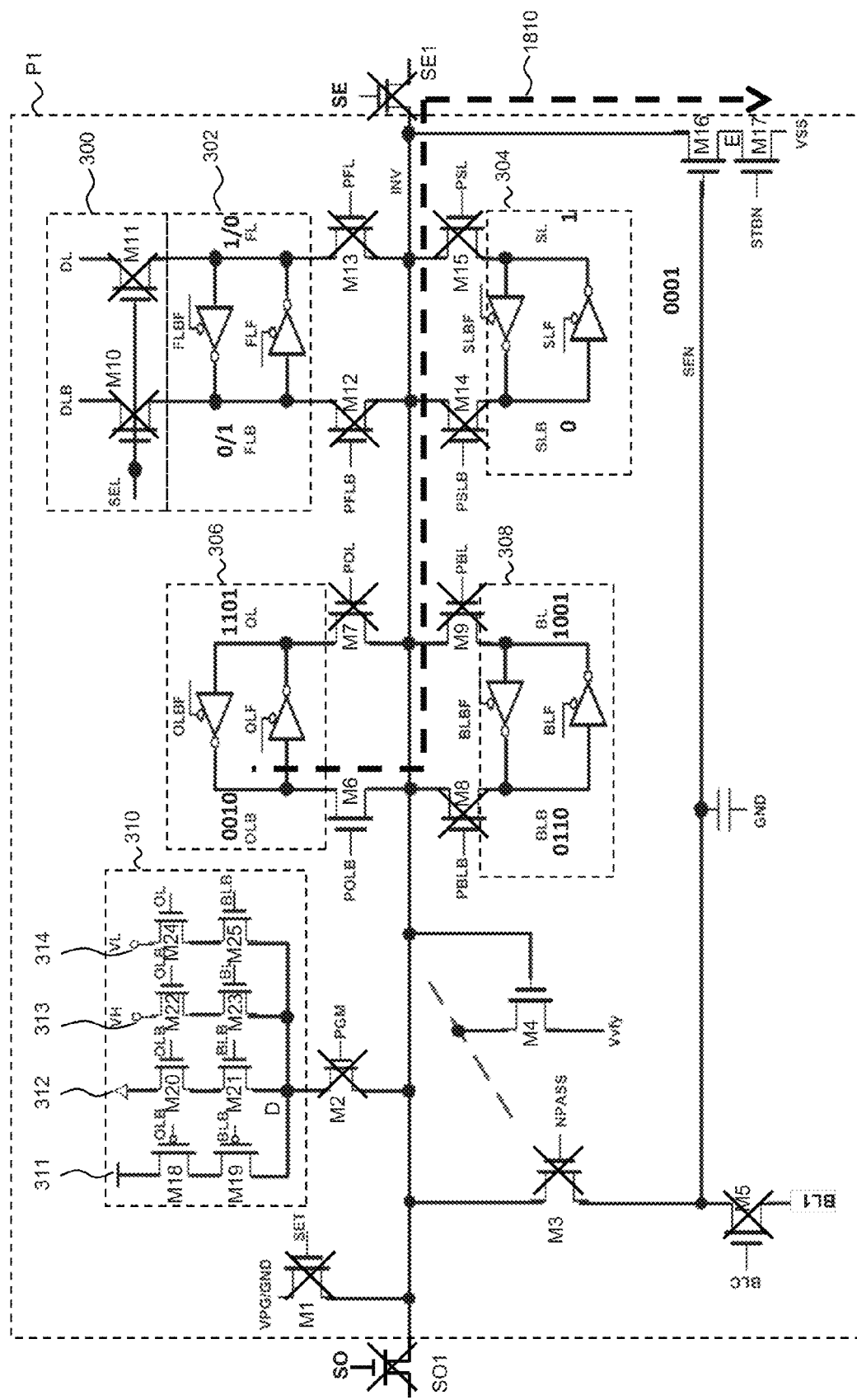

Referring to FIG. 18, controller 150 turns on switches M6 and M17 by respectively applying control signals POLB and STBN with the high level ("1") to the gates of these switches. Controller 150 turns off switches M1, M2, M3, M5, M7, M8, M9, M10, M11, M12, M13, M14, M15, 5O1, and SE1 by respectively applying control signals SET, PGM, NPASS, BLC, POL, PBLB, PBL, SEL, SEL, PFLB, PFL, PSLB, PSL, SO, and SE with the low level ("0") to the gates of these switches.

Switch M16 is turned on or off based on the data at terminal SEN of page buffer P1, represented by voltage $V_{SEN}$. When the data at terminal SEN is "1", switch M16 is turned on. As a result, the voltage $V_{INV}$ at terminal INV of page buffer P1 is pulled down to "0" by the system voltage $V_{SS}$ (e.g., ground), which is applied at the second terminal of switch M17, via a path 1810. Voltage $V_{OLB}$ at terminal OLB is also pulled down to "0" by the system voltage Vss, via path 1810. Voltage $V_{OL}$ at terminal OL is phase-inverse to $V_{OLB}$; therefore, $V_{OL}$="1". On the other hand, when the data at terminal SEN is "0", switch M16 is turned off. As a result, the data at terminal INV of page buffer P1 remains unchanged. Consequently, the data at terminals OL and OLB remain unchanged. That is, when $V_{SEN}$="0", "0", "0", or "1", $V_{OLB}$="0", "0", "1", or "0", and $V_{OL}$="1", "1", "0", or "1", respectively. At this time, the data at terminals BLB, BL, FLB, FL, SLB, and SL remain unchanged.

Figure 19:
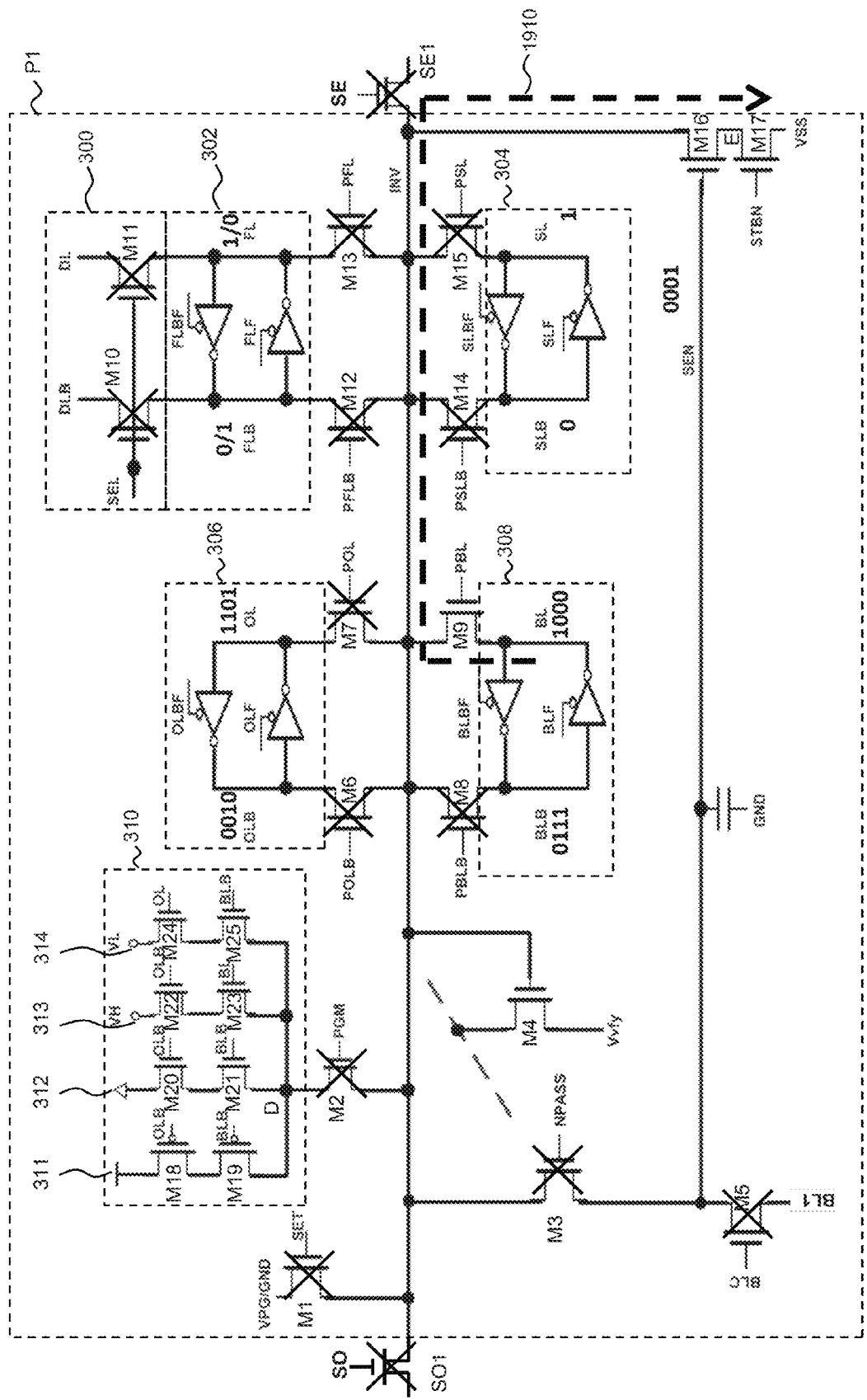

Referring to FIG. 19, controller 150 turns on switches M9 and M17 by respectively applying control signals PBL and STBN with the high level ("1") to the gates of these switches. Controller 150 turns off switches M1, M2, M3, M5, M6, M7, M8, M10, M11, M12, M13, M14, M15, SO1, and SE1 by respectively applying control signals SET, PGM, NPASS, BLC, POLB, POL, PBLB, SEL, SEL, PFLB, PFL, PSLB, PSL, SO, and SE with the low level ("0") to the gates of these switches.

Switch M16 is turned on or off based on the data at terminal SEN of page buffer P1, represented by voltage $V_{SEN}$. When the data at terminal SEN is "1", switch M16 is turned on. As a result, the voltage $V_{INV1}$ at terminal INV of page buffer P1 is pulled down to "0" by the system voltage $V_{SS}$ (e.g., ground), which is applied at the second terminal of switch M17, via a path 1910. Voltage $V_{BL}$ at terminal BL is also pulled down to "0" by the system voltage Vss, via path 1910. Voltage $V_{BLB}$ at terminal BLB is phase-inverse to $V_{BL}$; therefore, $V_{BLB}$="1". On the other hand, when the data at terminal SEN is "0", switch M16 is turned off. As a result, the data at terminal INV of page buffer P1 remains unchanged. Consequently, the data at terminals BL and BLB remain unchanged. That is, when $V_{SEN}$="0", "0", "0", or "1", $V_{BL}$="1", "0", "0", or "0", and $V_{BLB}$="0", "1", "1", or "1", respectively. At this time, the data at terminals OLB, OL, FLB, FL, SLB, and SL remain unchanged.

Figure 20:
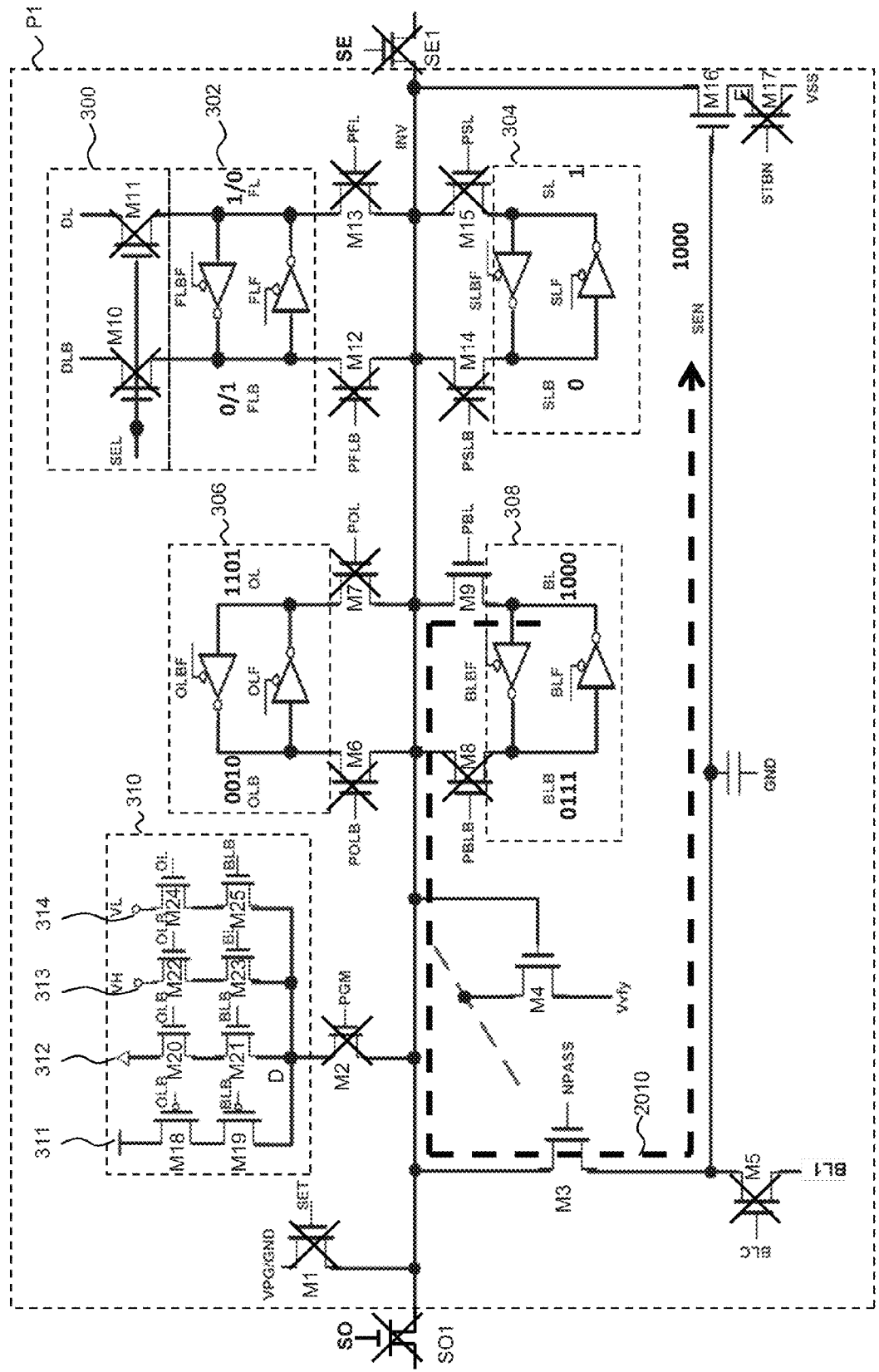

Referring to FIG. 20, controller 150 turns on switches M3 and M9 by respectively applying control signals NPASS and PBL with the high level ("1") to the gates of these switches. Controller 150 turns off switches M1, M2, M5, M6, M7, M8, M10, M11, M12, M13, M14, M15, M17, SO1, and SE1 by respectively applying control signals SET, PGM, BLC, POLB, POL, PBLB, SEL, SEL, PFLB, PFL, PSLB, PSL, STBN, SO, and SE with the low level ("0") to the gates of these switches.

As a result, the data at terminal BL of both-side latch 308 is transferred to terminal SEN via a path 2010. That is, when $V_{BL}$="1", "0", "0", or "0", $V_{SEN}$="1", "0", "0", or "0", respectively. At this time, the data at terminals OLB, OL, BLB, BL, FLB, FL, SLB, and SL remain unchanged.

Figure 21:
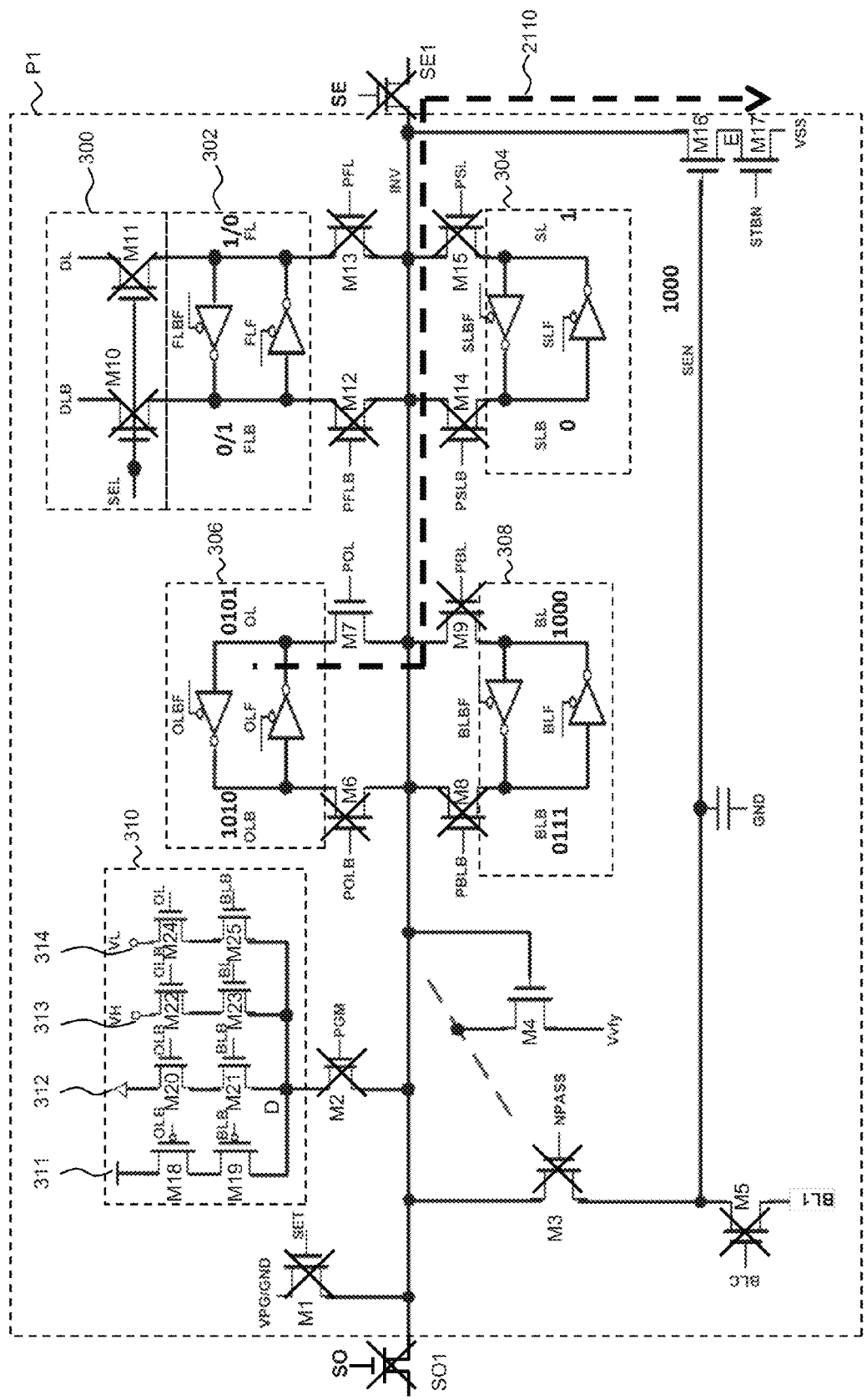

Referring to FIG. 21, controller 150 turns on switches M7 and M17 by respectively applying control signals POL and STBN with the high level ("1") to the gates of these switches. Controller 150 turns off switches M1, M2, M3, M5, M6, M8, M9, M10, M11, M12, M13, M14, M15, 5O1, and SE1 by respectively applying control signals SET, PGM, NPASS, BLC, POLB, PBLB, PBL, SEL, SEL, PFLB, PFL, PSLB, PSL, SO, and SE with the low level ("0") to the gates of these switches.

Switch M16 is turned on or off based on the data at terminal SEN of page buffer P1, represented by voltage $V_{SEN}$. When the data at terminal SEN is "1", switch M16 is turned on. As a result, the voltage $V_{INV}$ at terminal INV is pulled down to "0" by the system voltage $V_{SS}$ (e.g., ground), which is applied at the second terminal of switch M17, via a path 2110. Voltage $V_{OL}$ at terminal OL is also pulled down to "0" by the system voltage Vss, via a path 2110. Voltage $V_{OLB}$ at terminal OLB is phase-inverse to $V_{OL}$; therefore, $V_{OLB}$="1". On the other hand, when the data at terminal SEN is "0", switch M16 is turned off. As a result, the data at terminal INV of page buffer P1 remains unchanged. Consequently, the data at terminals OL and OLB remain unchanged. That is, when $V_{SEN}$="1", "0", "0", or "0", $V_{OL}$="0", "1", "0", or "1", and $V_{OLB}$="1", "0", "1", or "0", respectively. At this time, the data at terminals BLB, BL, FLB, FL, SLB, and SL remain unchanged.

Self Data Processing

FIGS. 22-26 are circuit diagrams of page buffer P1 during the self data processing operation (step 422), according to an illustrated embodiment. The self data processing operation of page buffer P2 is similar to that of page buffer P1. Therefore, separate description of the self data processing operation of page buffer P2 is not provided.

Figure 22:
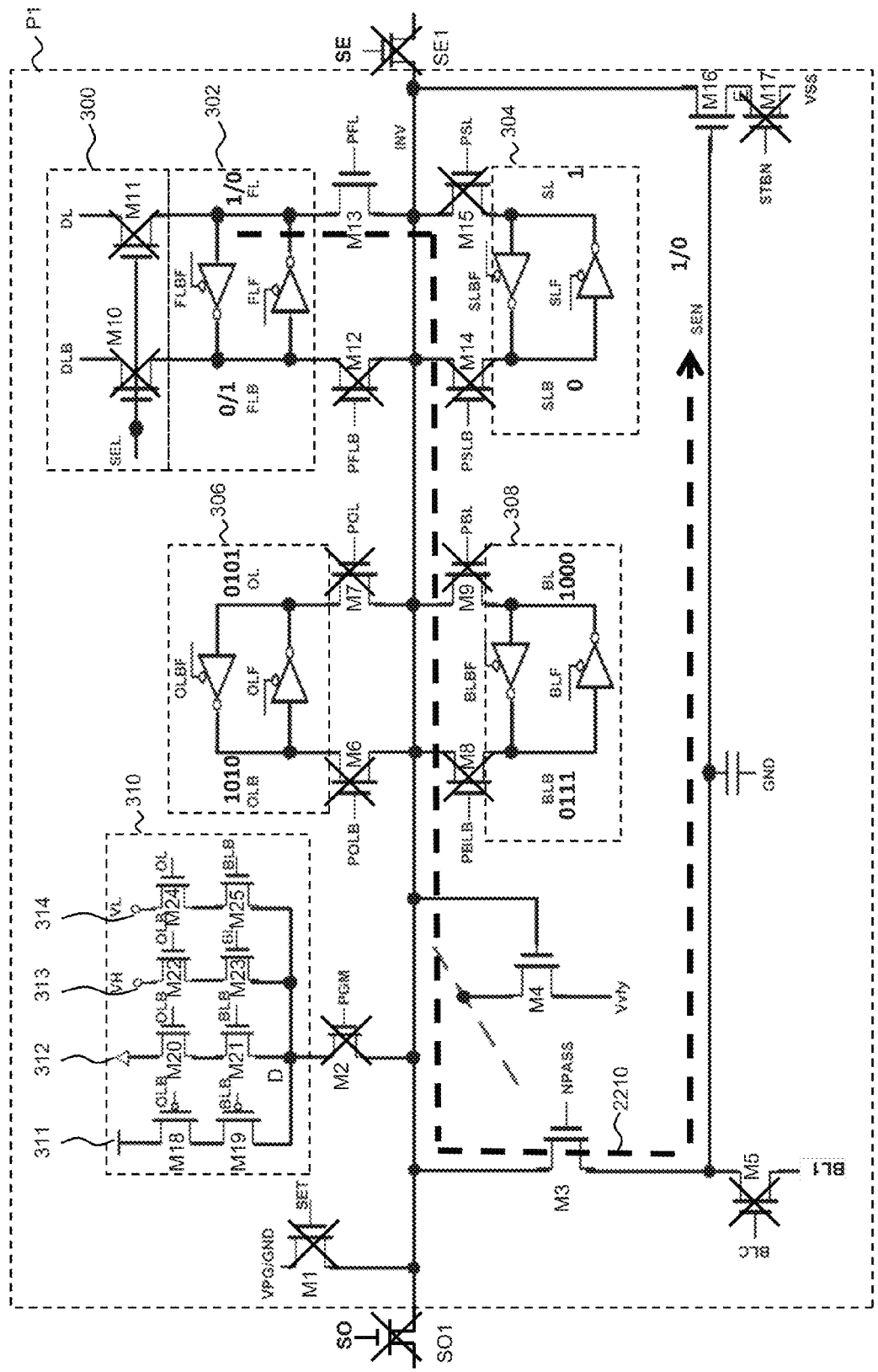
FIGS. 22-26 are circuit diagrams of a page buffer during a self data processing operation, according to an illustrated embodiment.

Referring to FIG. 22, first, controller 150 turns on switches M3 and M13 by respectively applying control signals NPASS and PFL with the high level ("1") to the gates of these switches. Controller 150 turns off switches M1, M2, M5, M6, M7, M8, M9, M10, M11, M12, M14, M15, M17, 501, and SE1 by respectively applying control signals SET, PGM, BLC, POLB, POL, PBLB, PBL, SEL, SEL, PFLB, PSLB, PSL, STBN, SO, and SE with the low level ("0") to the gates of these switches.

As a result, the data at terminal FL of first latch 302 is transferred to terminal SEN via a path 2210. That is, when $V_{FL}$="1", $V_{SEN}$="1"; and when $V_{FL}$="0", $V_{SEN}$="0". At this time, the data at terminals OLB, OL, BLB, BL, FLB, FL, SLB, and SL remain unchanged. In FIG. 22, the data at terminals OL, OLB, BL, and BLB are labeled as $V_{OL}$="0", "1", "0", or "1", $V_{OLB}$="1", "0", "1", or "0", $V_{BL}$="1", "0", "0", or "0", and $V_{BLB}$="0", "1", "1", or "1" as the possible combination of data at terminals OL, OLB, BL, and BLB, after the neighbor data processing operation (step 420).

Figure 23:
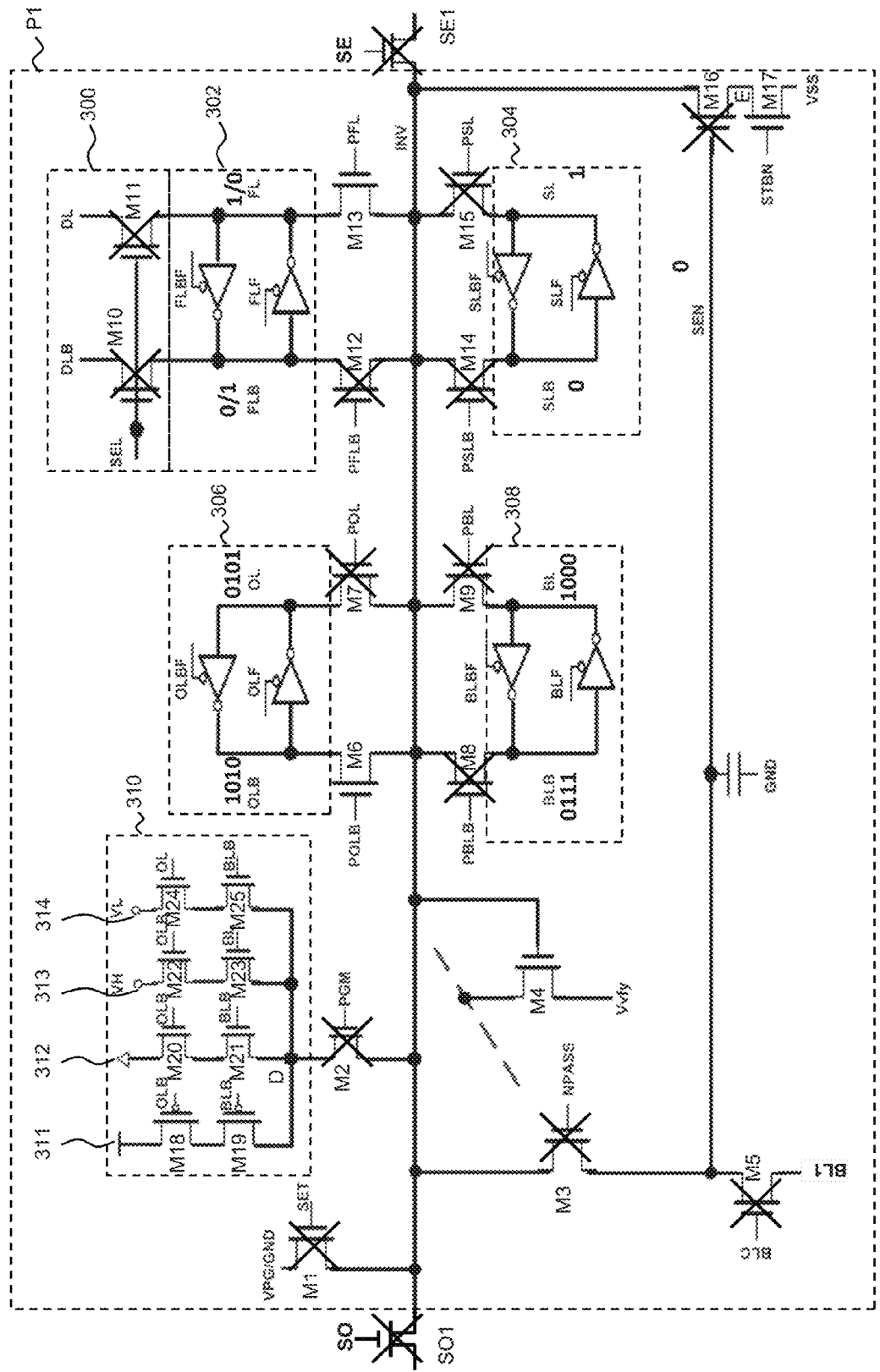

Referring to FIG. 23, controller 150 turns on switches M6 and M17 by respectively applying control signals POLB and STBN with the high level ("1") to the gates of these switches. Controller 150 turns off switches M1, M2, M3, M5, M7, M8, M9, M10, M11, M12, M13, M14, M15, SO1, and SE1 by respectively applying control signals SET, PGM, NPASS, BLC, POL, PBLB, PBL, SEL, SEL, PFLB, PFL, PSLB, PSL, SO, and SE with the low level ("0") to the gates of these switches.

Switch M16 is turned on or off based on the data at terminal SEN of page buffer P1, represented by voltage $V_{SEN}$. When the data at terminal SEN is "0", switch M16 is turned off. As a result, the data at terminal INV remains unchanged. Consequently, the data at terminals OL and OLB remain unchanged. That is, when $V_{SEN}$="0", $V_{OLB}$="1", "0", "1", or "0", and $V_{OL}$="0", "1", "0", or "1", respectively. At this time, the data at terminals BLB, BL, FLB, FL, SLB, and SL remain unchanged.

Figure 24:
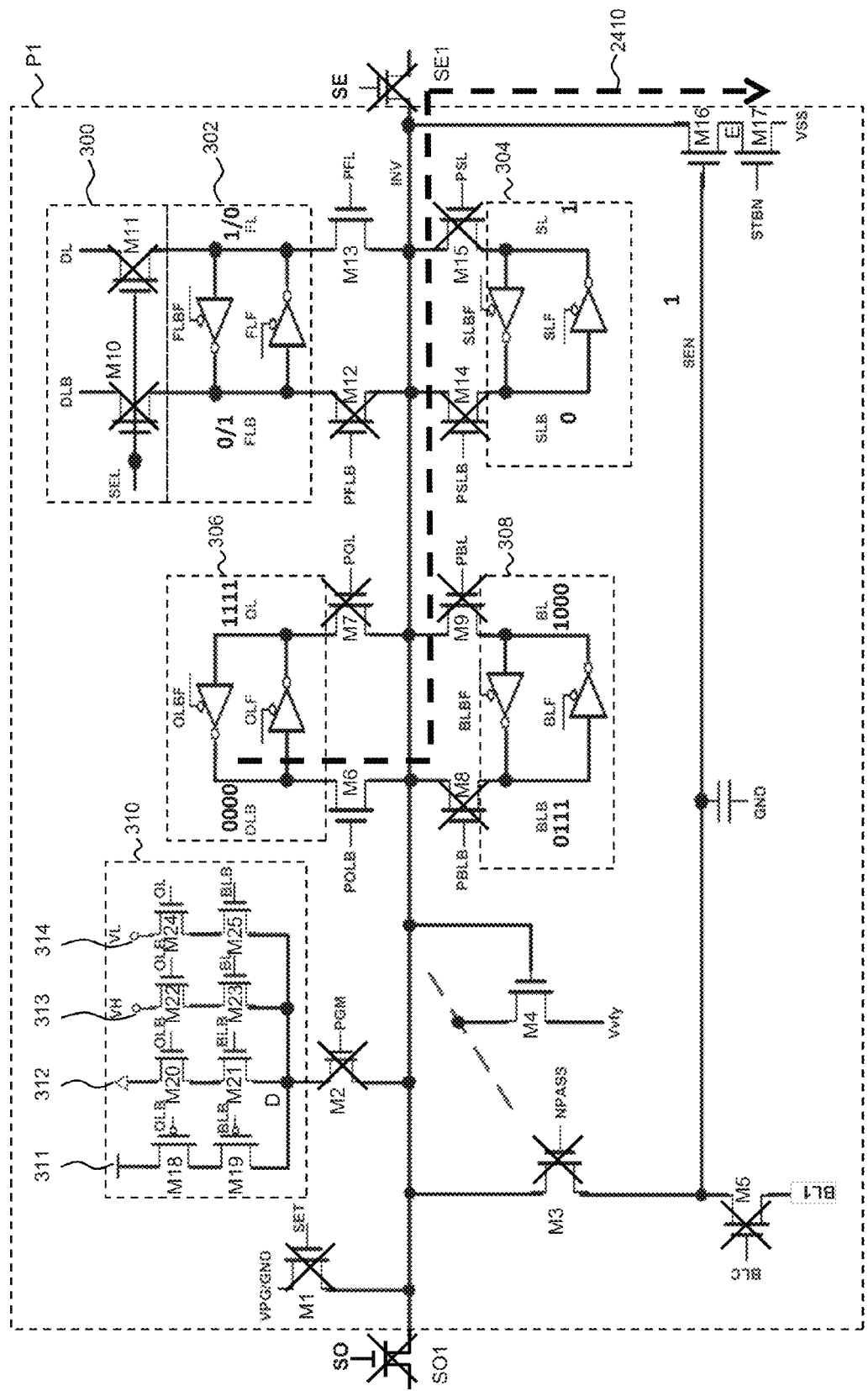

On the other hand, as illustrated in FIG. 24, when the data at terminal SEN is "1", switch M16 is turned on. As a result, the voltage $V_{INV}$ at terminal INV is pulled down to "0" by the system voltage $V_{SS}$ (e.g., ground), which is applied at the second terminal of switch M17, via a path 2410. Voltage $V_{OLB}$ at terminal OLB is also pulled down to "0" by the system voltage Vss, via path 2410. Voltage $V_{OL}$ at terminal OL is phase-inverse to $V_{OLB}$; therefore, $V_{OL}$="1". That is, when $V_{SEN}$="1", $V_{OLB}$="0", "0", "0", or "0", and $V_{OL}$="1", "1", "1", or "1", respectively. At this time, the data at terminals BLB, BL, FLB, FL, SLB, and SL remain unchanged.

Figure 25:
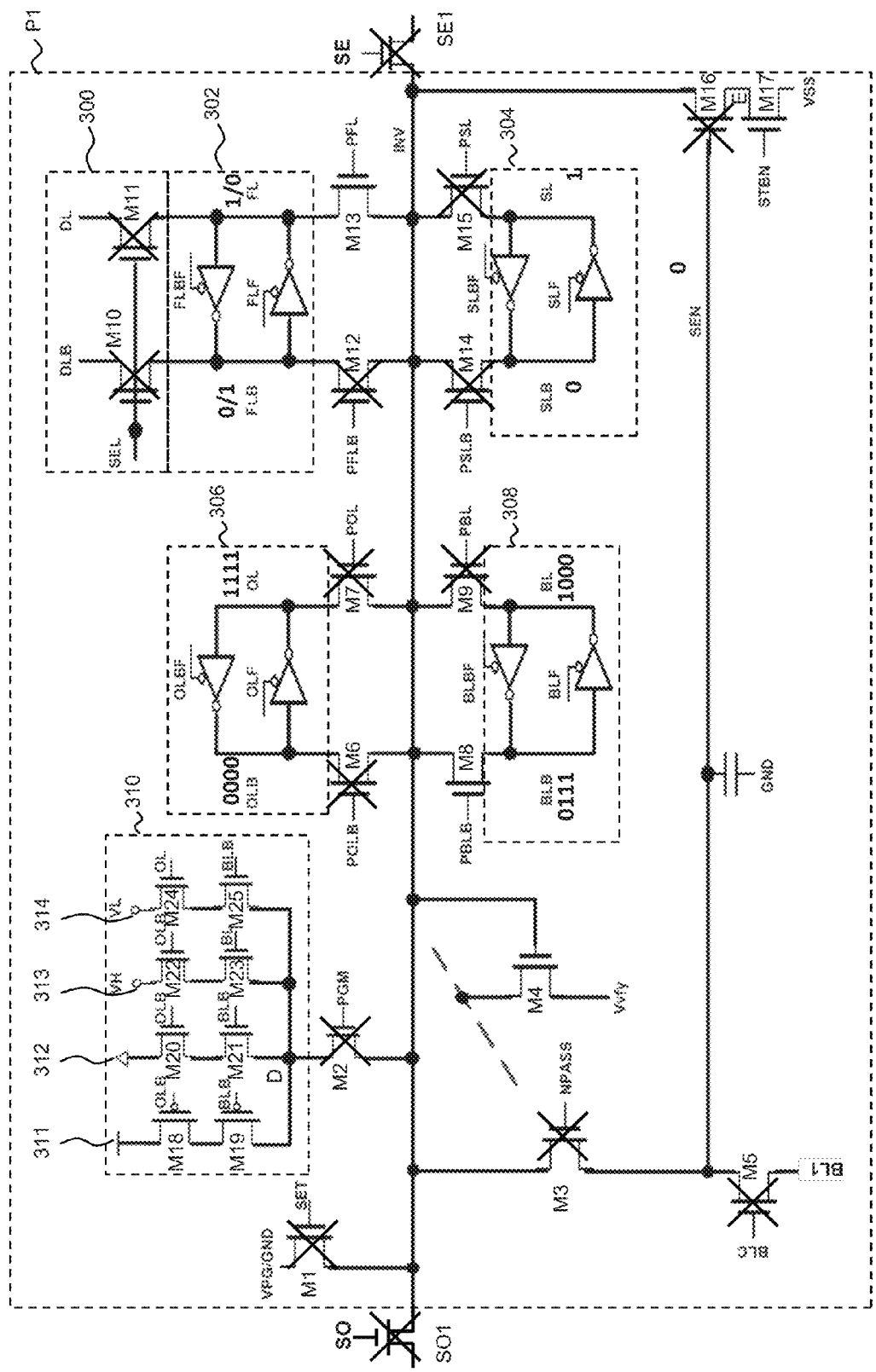

Referring to FIG. 25, controller 150 turns on switches M8 and M17 by respectively applying control signals PBLB and STBN with the high level ("1") to the gates of these switches. Controller 150 turns off switches M1, M2, M3, M5, M6, M7, M9, M10, M11, M12, M13, M14, M15, SO1, and SE1 by respectively applying control signals SET, PGM, NPASS, BLC, POLB, POL, PBL, SEL, SEL, PFLB, PFL, PSLB, PSL, SO, and SE with the low level ("0") to the gates of these switches.

Switch M16 is turned on or off based on the data at terminal SEN of page buffer P1, represented by voltage $V_{SEN}$. When the data at terminal SEN is "0", switch M16 is turned off. As a result, the data at terminal INV remains unchanged. Consequently, the data at terminals BL and BLB remain unchanged. That is, when $V_{SEN}$="0", $V_{BLB}$="0", "1", "1", or "1", and $V_{BL}$="1", "0", "0", or "0", respectively. At this time, the data at terminals OLB, OL, FLB, FL, SLB, and SL remain unchanged.

Figure 26:
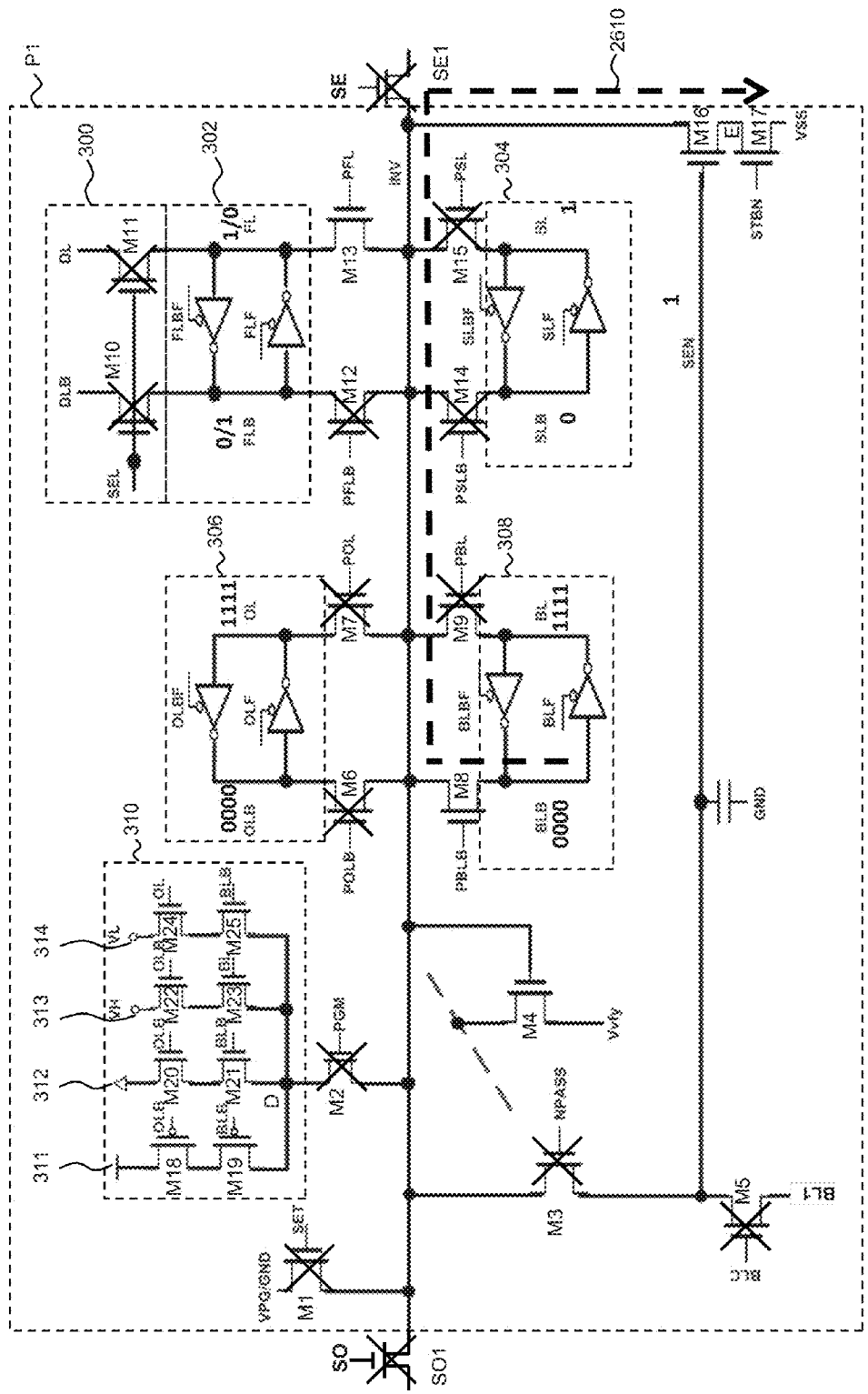

On the other hand, as illustrated in FIG. 26, when the data at terminal SEN is "1", switch M16 is turned on. As a result, the voltage $V_{INV}$ at terminal INV is pulled down to "0" by the system voltage $V_{SS}$ (e.g., ground), which is applied at the second terminal of switch M17, via a path 2610. Voltage $V_{BLB}$ at terminal BLB is also pulled down to "0" by the system voltage Vss, via path 2610. Voltage $V_{BL}$ at terminal BL is phase-inverse to $V_{BLB}$; therefore, $V_{BL}$="1". That is, when $V_{SEN}$="1", $V_{BLB}$="0", "0", "0", or "0", and $V_{BL}$="1", "1", "1", or "1", respectively. At this time, the data at terminals OLB, OL, FLB, FL, SLB, and SL remain unchanged.

As a result of the self data processing operation, when the input data of page buffer P1 is "0", the data at terminals OL and BL remain the same as previously set during the neighbor data processing operation. On the other hand, when the input data of page buffer P1 is "1", the data at terminals OL and BL become "1" regardless of their previous state during the neighbor data processing operation, indicating that the cell A corresponding to page buffer P1, as illustrated in FIG. 1, will be program inhibited.

FIG. 27 is a table 2700 summarizing the data at terminals OL and BL of page buffer P1 before and after the data processing operation. As explained previously, after the data shifting operation and before the data processing operation, the data at terminal OL of page buffer P1 represents the input data of its right-side neighbor, i.e., page buffer P2; and the data at terminal BL of page buffer P1 represents the input data of its left-side neighbor, i.e., page buffer P0.

After the data processing operation, a combination of the data at terminal OL and the data at terminal BL of page buffer P1 represents the program status of cell A corresponding to page buffer P1. Columns 2710 through 2750 of table 2700 represent five possible combinations of data at terminals OL and BL.

Specifically, referring to column 2710, before the data processing operation, $V_{OL}$="1", $V_{BL}$="1". After the data processing operation, $V_{OL}$="0", $V_{BL}$="1", indicating that both of the neighboring cells, i.e., cell C corresponding to page buffer P2 and cell B corresponding to page buffer P0, will be program inhibited, i.e., "both side inhibit." In such case, a bit line BL1 corresponding to page buffer P1 needs to be charged to a bit line compensation bias level of $V_H$ during the program operation.

Referring to column 2720, before the data processing operation, $V_{OL}$="1", $V_{BL}$="0". After the data processing operation, $V_{OL}$="1", $V_{BL}$="0", indicating that one of cell C and cell B will be program inhibited, i.e., "one side inhibit." In such case, bit line BL1 needs to be charged to a bit line compensation bias level of $V_L$ during the program operation.

Referring to column 2730, before the data processing operation, $V_{OL}$="0", $V_{BL}$="0". After the data processing operation, $V_{OL}$="0", $V_{BL}$="0", indicating that neither one cell C and cell B will be program inhibited, i.e., "no side inhibit." In such case, bit line BL1 needs to be discharged to ground GND during the program operation.

Referring to column 2740, before the data processing operation, $V_{OL}$="0", $V_{BL}$="1". After the data processing operation, $V_{OL}$="1", $V_{BL}$="0", indicating that one of cell C and cell B will be program inhibited, i.e., "one side inhibit." In such case, bit line BL1 needs to be charged to the bit line compensation bias level of $V_L$ during the program operation.

Referring to column 2750, after the data processing operation, $V_{OL}$="1", $V_{BL}$="1", indicating that cell A will be program inhibited. In such case, bit line BL1 needs to be charged to voltage $V_{DD}$ during the program operation.

Programming

Figure 28:
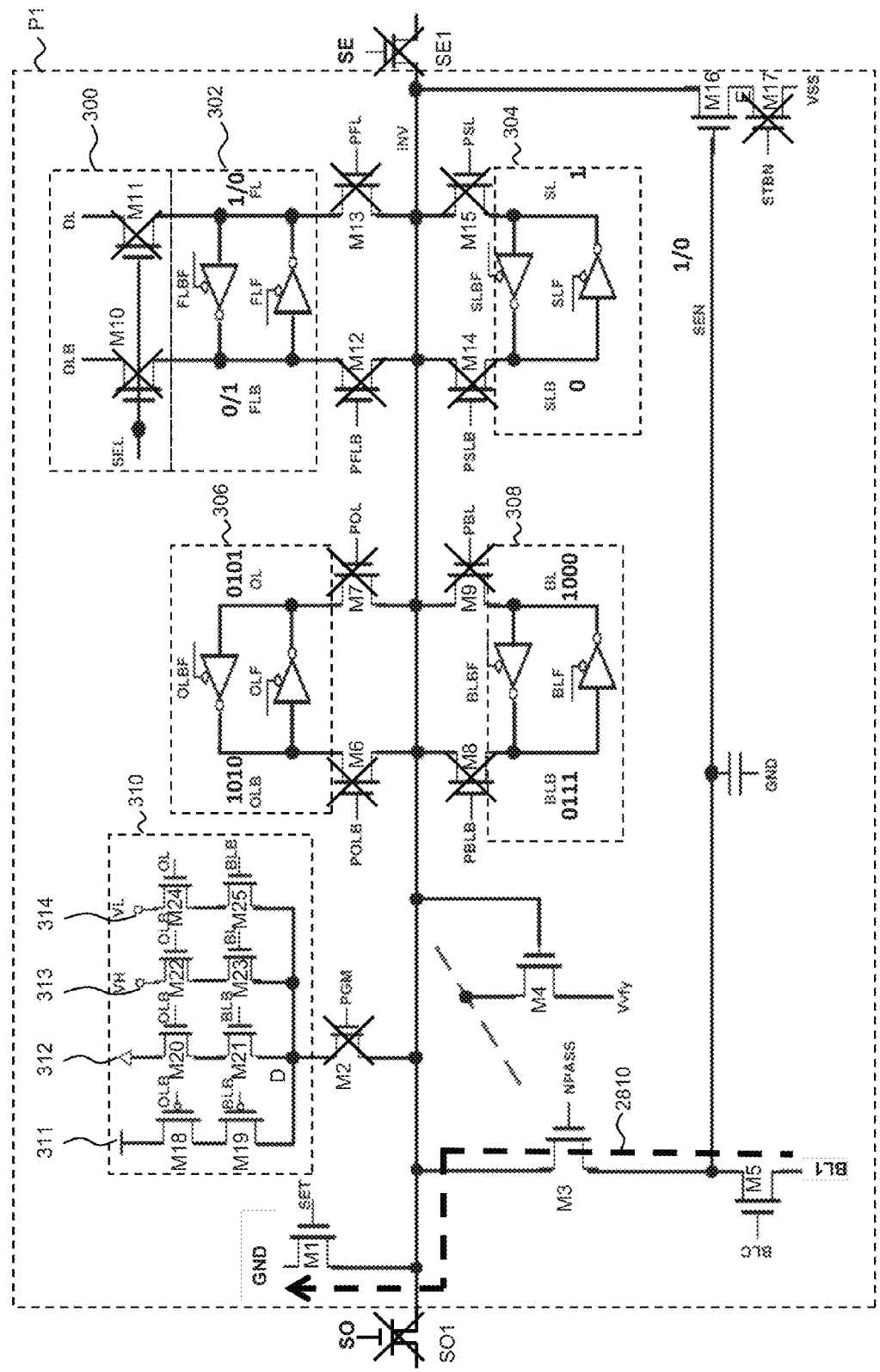
FIGS. 28-29 are circuit diagrams of a page buffer during a programming operation, according to an illustrated embodiment.
Figure 29:
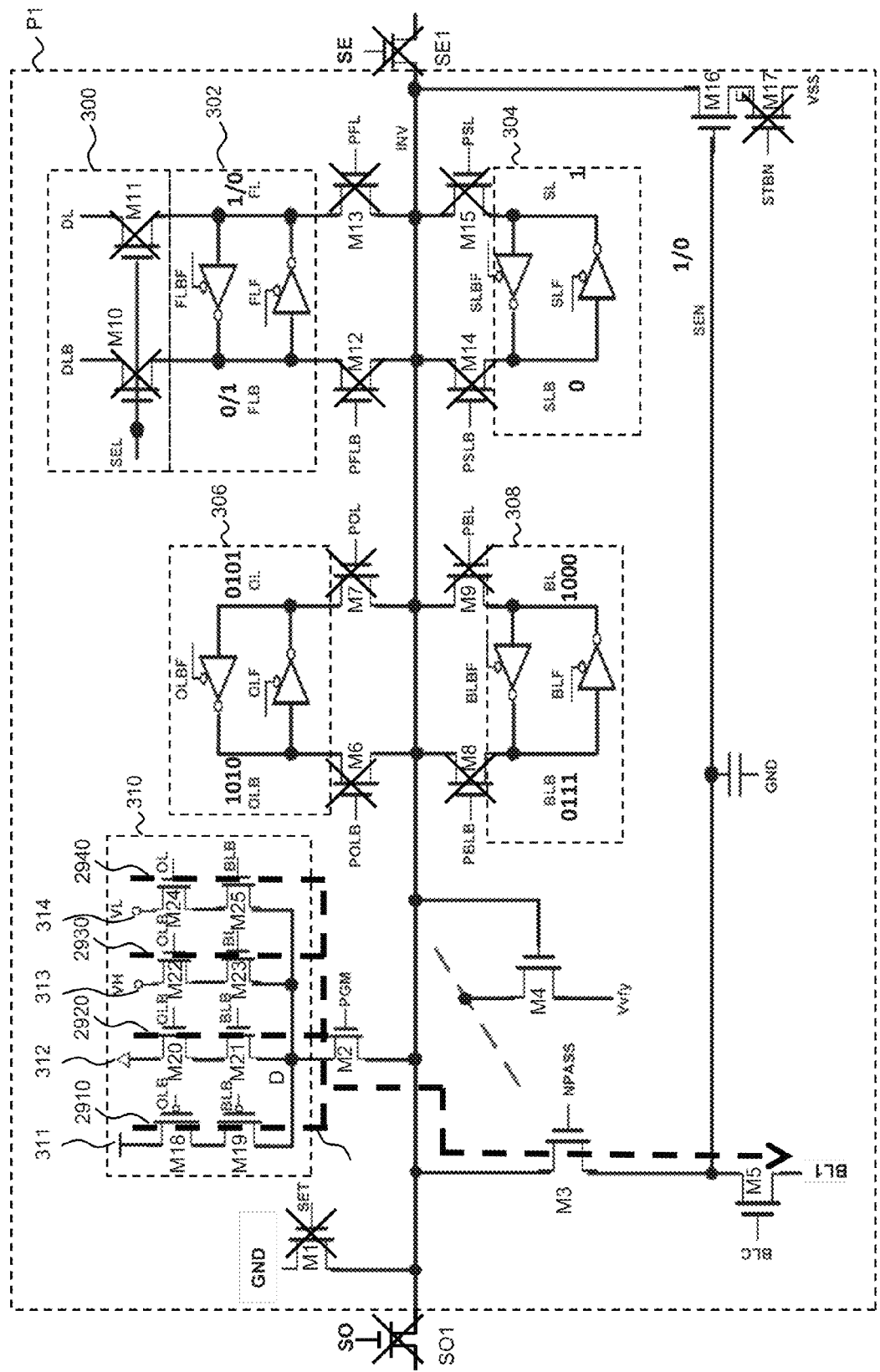

FIGS. 28 and 29 are circuit diagrams of page buffer P1 during the programming operation (step 424), according to an illustrated embodiment. The programming operations of page buffers P0, P2, and P3 are similar to that of page buffer P1. Therefore, separate descriptions of the programming operations of page buffers P0, P2, and P3 are not provided.

Referring to FIG. 28, controller 150 turns on switches M1, M3, and M5, by respectively applying control signals SET, NPASS, and BLC with a high level ("1") to the gates of these switches. Controller 150 turns off switches M2, M6, M7, M8, M9, M10, M11, M12, M13, M14, M15, M17, SO1, and SE1 by respectively applying control signals PGM, POLB, POL, PBLB, PBL, SEL, SEL, PFLB, PFL, PSLB, PSL, STBN, SO, and SE with a low level ("0") to the gates of these switches. The on/off status of each one of M4 and M16 depends on its gate bias, but does not affect the circuit operation.

At the same time, controller 150 applies a control signal GND to the first terminal of switch M1. As a result, a bit line BL1 of memory array 100 is discharged to ground via a path 2810.

Referring to FIG. 29, controller 150 then turns on switches M2, M3, and M5, by respectively applying control signals PGM, NPASS, and BLC with a high level ("1") to the gates of these switches. Controller 150 turns off switches M1, M6, M7, M8, M9, M10, M11, M12, M13, M14, M15, M17, 501, and SE1 by respectively applying control signals SET, POLB, POL, PBLB, PBL, SEL, SEL, PFLB, PFL, PSLB, PSL, STBN, SO, and SE with a low level ("0") to the gates of these switches.

Bit line BL1 of memory array 100 is charged or discharged via either one of paths 2910, 2920, 2930, and 2940, based on the data on terminals OLB, OL, BLB, and BL. Specifically, when $V_{OL}$="1" and $V_{BL}$="1", i.e., when $V_{OLB}$="0" and $V_{BLB}$="0", both of switches M18 and M19, which are PMOS transistors, are turned on. As a result, bit line BL1 is charged to system voltage $V_{DD}$ (first bias voltage) applied at the first terminal of switch M18, via path 2910. In such case, cell A is program inhibited even if a high voltage, e.g. 20V, is applied to word line WL2.

When $V_{OL}$="0" and $V_{BL}$="0", i.e., when $V_{OLB}$="1" and $V_{BLB}$="1", both of switches M20 and M21, which are NMOS transistors, are turned on. As a result, bit line BL1 is discharged to ground (second bias voltage) applied at the first terminal of switch M20, via path 2920. In such case, if word line WL2 is applied with a high voltage, e.g. 20V, cell A is programmed.

When $V_{OL}$="0" and $V_{BL}$="1", i.e., when $V_{OLB}$="1" and $V_{BL}$="1", both of switches M22 and M23, which are NMOS transistors, are turned on. As a result, bit line BL1 is charged to voltage $V_H$ (third bias voltage) applied at the first terminal of switch M22, via path 2930. In such case, if word line WL2 is applied with a high voltage, e.g. 20V, cell A is compensated with a bias voltage of $V_H$.

When $V_{OL}$="1" and $V_{BL}$="0", i.e., when $V_{OL}$="1" and $V_{BLB}$="1", both of switches M24 and M25, which are NMOS transistors, are turned on. As a result, bit line BL1 is charged to voltage $V_L$ (fourth bias voltage) applied at the first terminal of switch M24, via path 2940. In such case, if word line WL2 is applied with a high voltage, e.g. 20V, cell A is compensated with a bias voltage of $V_L$.

Program-verification Operation

FIGS. 30-34 are circuit diagrams of page buffer P1 during the program-verification operation (step 426), according to an illustrated embodiment. The program-verification operations of page buffers P0, P2, and P3 are similar to that of page buffer P1. Therefore, separate descriptions of the program-verification operations of page buffers P0, P2, and P3 are not provided.

After the programming operation and before the program-verification operation, there are three possible situations. In the first situation, cell A has been program inhibited, indicated by $V_{FL}$="1" and $V_{FLB}$="0". In the second situation, cell A has been programmed, indicated by $V_{FL}$="0" and $V_{FLB}$="1", but the threshold voltage $V_{th}$ of cell A has not reached a targeted level. In the third situation, cell A has been programmed, also indicated by $V_{FL}$="0" and $V_{FLB}$="1", and the threshold voltage $V_{th}$ of cell A has reached a targeted level. In the following description, the three possible situations will be labeled together for VFL and VFLB. For example, $V_{FL}$="1", "0", or "0", and $V_{FLB}$="0", "1", or "1", as labeled in FIG. 30.

Figure 30:
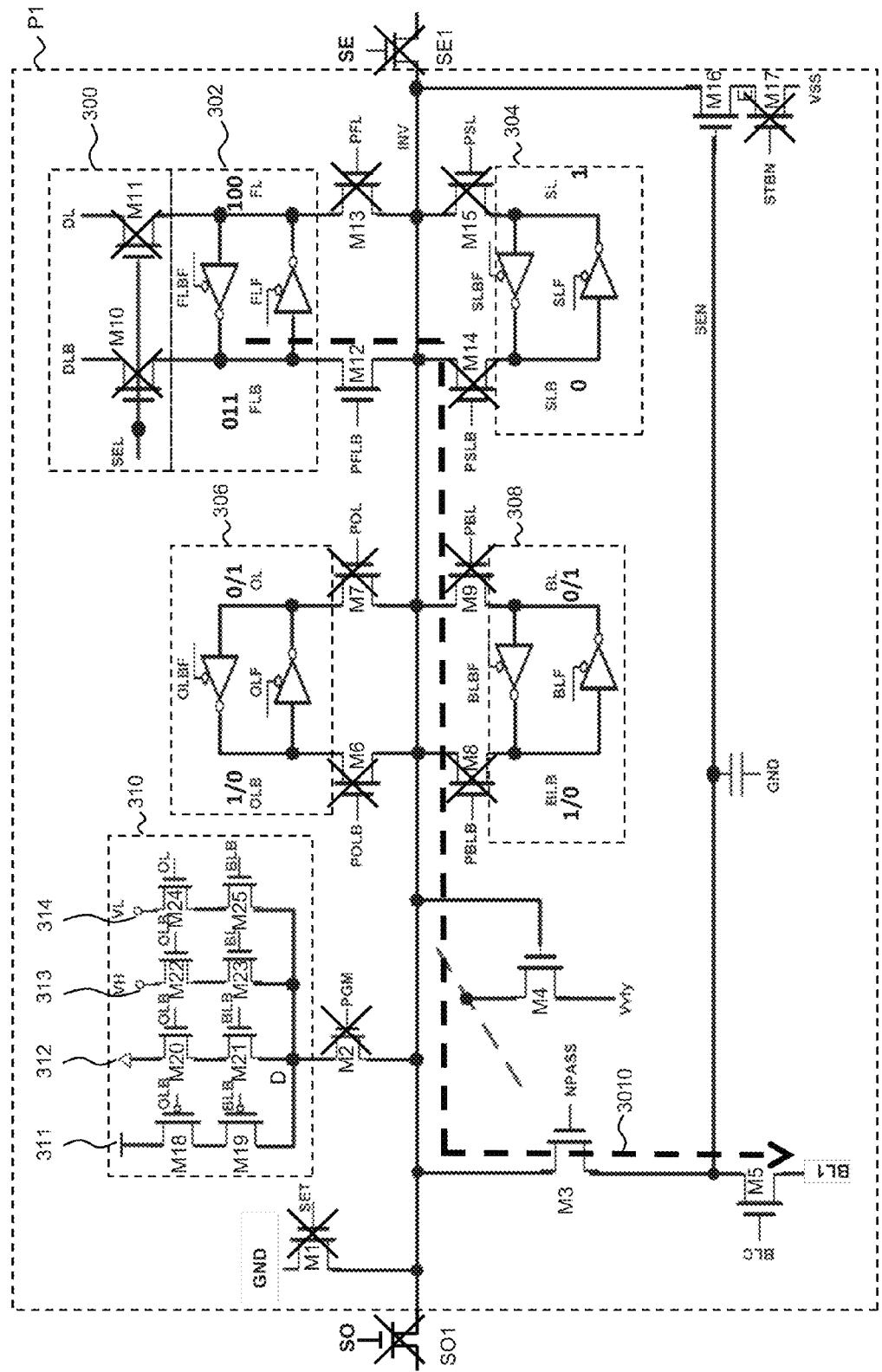
FIGS. 30-34 are circuit diagrams of a page buffer during a program-verification operation, according to an illustrated embodiment.

Referring to FIG. 30, controller 150 turns on switches M3, M5, and M12, by respectively applying control signals NPASS, BLC, and PFLB with a high level ("1") to the gates of these switches. Controller 150 turns off switches M1, M2, M6, M7, M8, M9, M10, M11, M13, M14, M15, M17, SO1, and SE1 by respectively applying control signals SET, PGM, POLB, POL, PBLB, PBL, SEL, SEL, PFL, PSLB, PSL, STBN, SO, and SE with a low level ("0") to the gates of these switches.

As a result, bit line BL1 of memory array is charged or discharged according to the data at terminal FLB via a path 3010. When $V_{FLB}$="1" (indicating that cell A has been programmed), bit line BL1 is charged to a high level represented by "1". When $V_{FLB}$="0" (indicating that cell A has been program inhibited), bit line BL1 is discharged to ground level.

Figure 31:
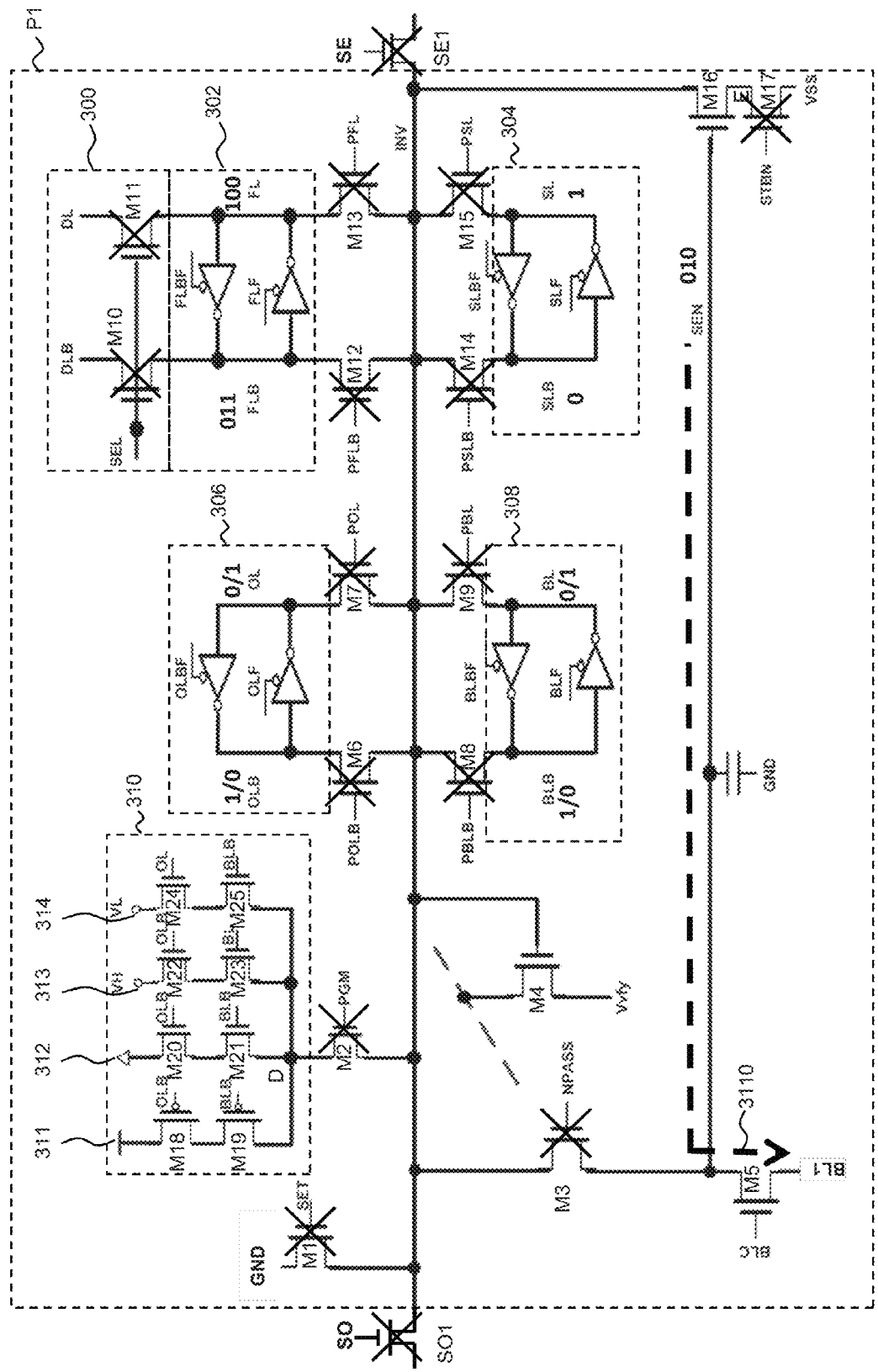

Referring to FIG. 31, controller 150 turns on switch M5 by applying a control signal BLC with a high level ("1") to its gate. Controller 150 turns off switches M1, M2, M3, M6, M7, M8, M9, M10, M11, M12, M13, M14, M15, M17, SO1, and SE1 by respectively applying control signals SET, PGM, NPASS, POLB, POL, PBLB, PBL, SEL, SEL, PFLB, PFL, PSLB, PSL, STBN, SO, and SE with a low level ("0") to the gates of these switches.

At the same time, controller 150 applies a program-verify voltage $V_{PV}$ to word line WL2 corresponding to cell A, and applies a high voltage to the other cells in memory string 121, to turn on these cells regardless their programming statues. The program-verify voltage $V_{PV}$ represents the target programming level for the threshold voltage $V_{th}$.

As a result, if cell A has been program inhibited (the above-described first situation), cell A is turned off. Although the other cells on memory string 121 are turned on, bit line BL1 remains at the ground level, i.e., "0". Consequently, the voltage at terminal SEN is "0".

If cell A has been programmed but its threshold voltage $V_{th}$ has not reached the targeted level (the above-described second situation), i.e., Vth<$V_{PV}$, cell A is turned off. Although the other cells on memory string 121 are turned on, bit line BL1 is not conductive, and thus remains at the high level represented by "1". Consequently, the voltage at terminal SEN is "1".

If cell A has been programmed and the threshold voltage $V_{th}$ of cell A has reached the targeted level (the above-described third situation), i.e., $V_{th} \geq V_{PV}$, cell A is turned on. Because the other cells on memory string 121 are also turned on, bit line BL1 is discharged to ground level. Consequently, the voltage at terminal SEN is pulled down to "0" via a path 3110.

Figure 32:
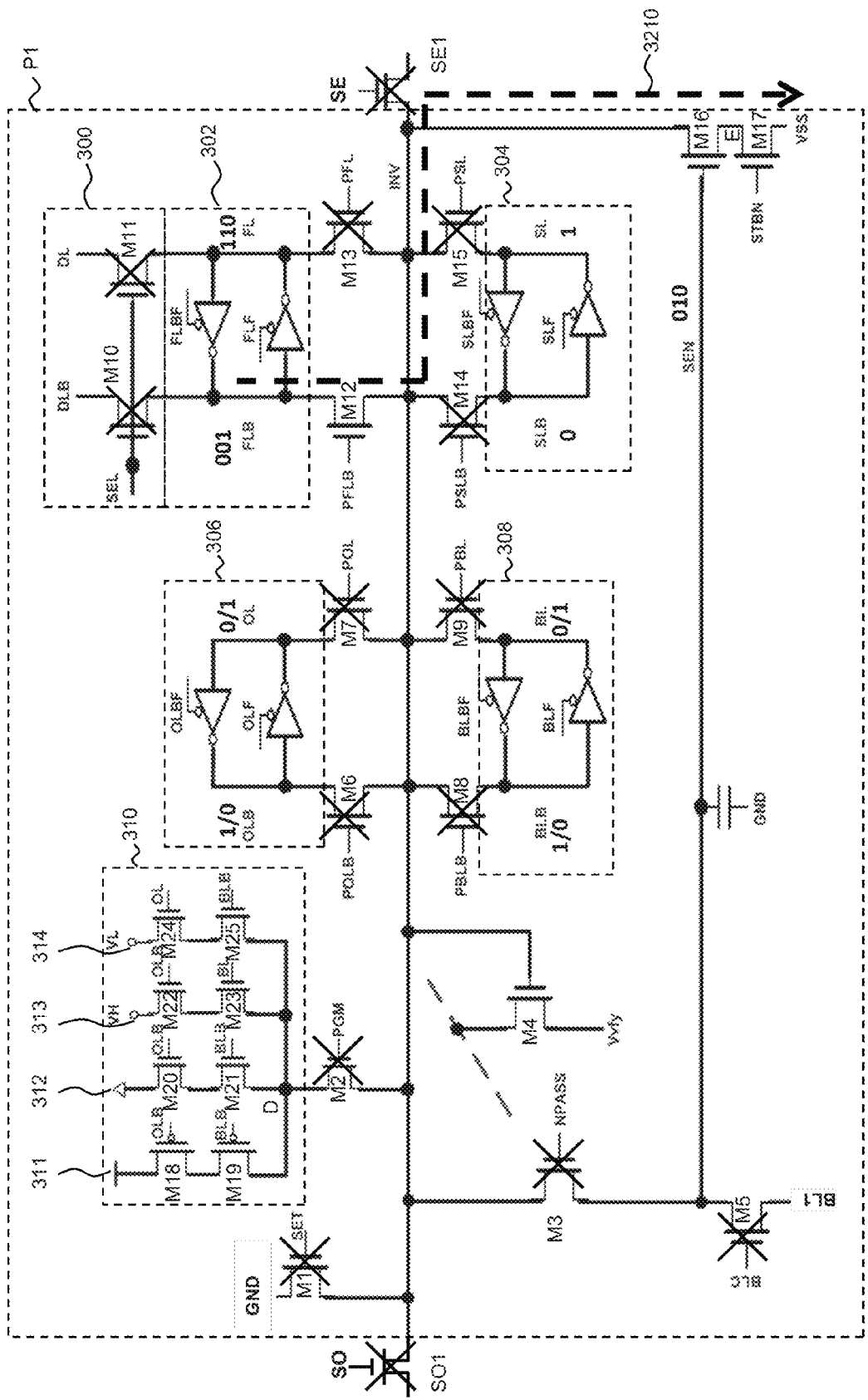

Referring to FIG. 32, controller 150 turns on switches M12 and M17 by respectively applying control signals PFLB and STBN with a high level ("1") to the gates of these switches. Controller 150 turns off switches M1, M2, M3, M5, M6, M7, M8, M9, M10, M11, M13, M14, M15, SO1, and SE1 by respectively applying control signals SET, PGM, NPASS, BLC, POLB, POL, PBLB, PBL, SEL, SEL, PFL, PSLB, PSL, SO, and SE with a low level ("0") to the gates of these switches.

Switch M16 is turned on or off based on the data at terminal SEN of page buffer P1, represented by voltage $V_{SEN}$. When the data at terminal SEN is "1", switch M16 is turned on. As a result, the voltage $V_{INV}$ at terminal INV is pulled down to "0" by the system voltage $V_{SS}$ (e.g., ground), which is applied at the second terminal of switch M17, via a path 3210. Voltage $V_{FLB}$ at terminal FLB is also pulled down to "0" by the system voltage Vss, via path 3210. Voltage $V_{FL}$ at terminal FL is phase-inverse to $V_{FLB}$; therefore, $V_{FL}$="1". On the other hand, when the data at terminal SEN is "0", switch M16 is turned off. As a result, the data at terminal INV of page buffer P1 remains unchanged. Consequently, the data at terminals FL and FLB remain unchanged. That is, when $V_{SEN}$="0", "1", or "0", $V_{FLB}$="0", "0", or "1", and $V_{FL}$="1", "1", or "0", respectively. At this time, the data at terminals OLB, OL, BLB, BL, SLB, and SL remain unchanged.

Figure 33:
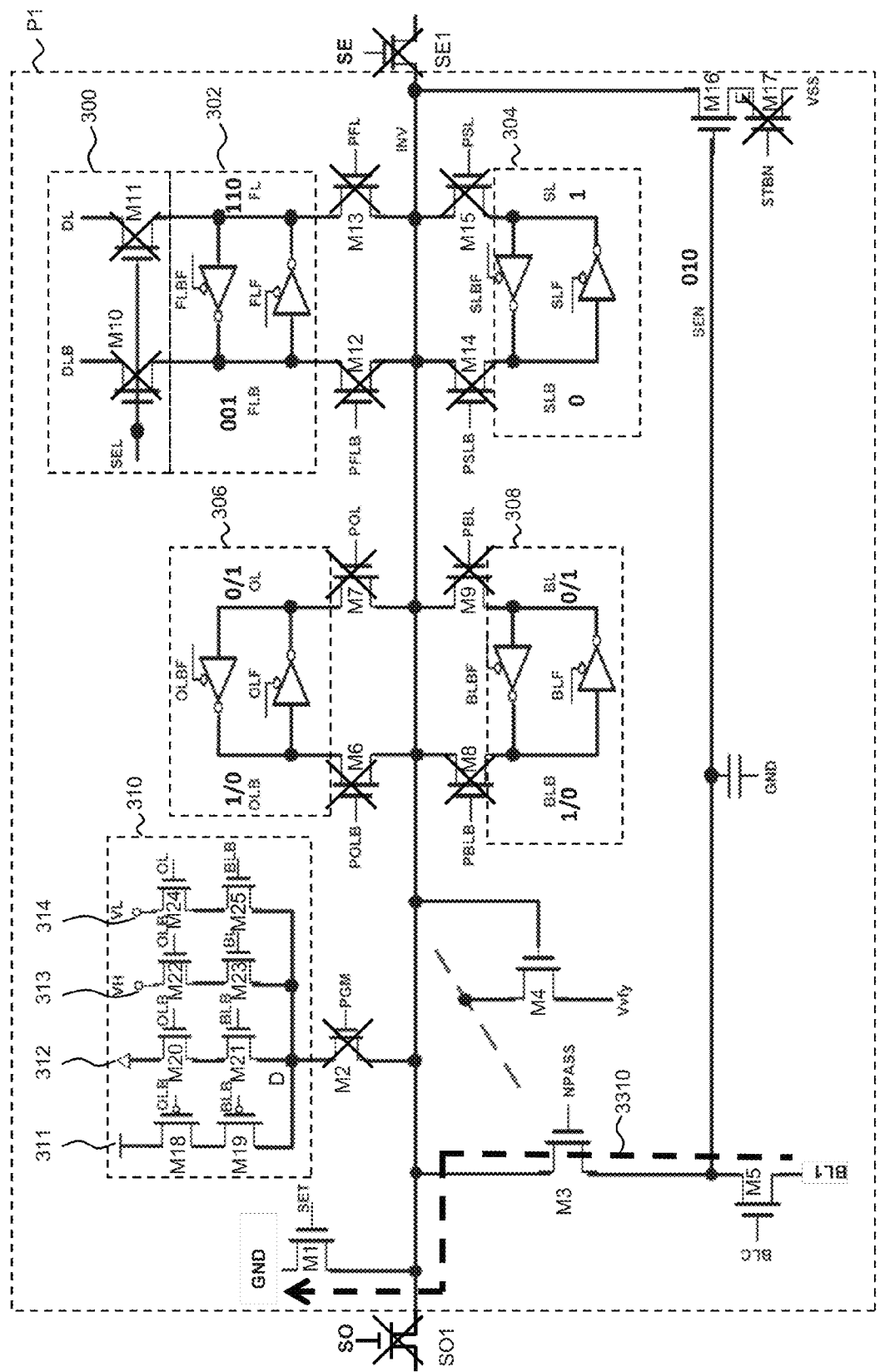

Referring to FIG. 33, controller 150 turns on switches M1, M3, and M5, by respectively applying control signals SET, NPASS, and BLC with a high level ("1") to the gates of these switches. Controller 150 turns off switches M2, M6, M7, M8, M9, M10, M11, M12, M13, M14, M15, M17, 501, and SE1 by respectively applying control signals PGM, POLB, POL, PBLB, PBL, SEL, SEL, PFLB, PFL, PSLB, PSL, STBN, SO, and SE with a low level ("0") to the gates of these switches.

At the same time, controller 150 applies a control signal GND to the first terminal of switch M1. As a result, bit line BL1 of memory array 100 is discharged to ground via a path 3310.

Figure 34:
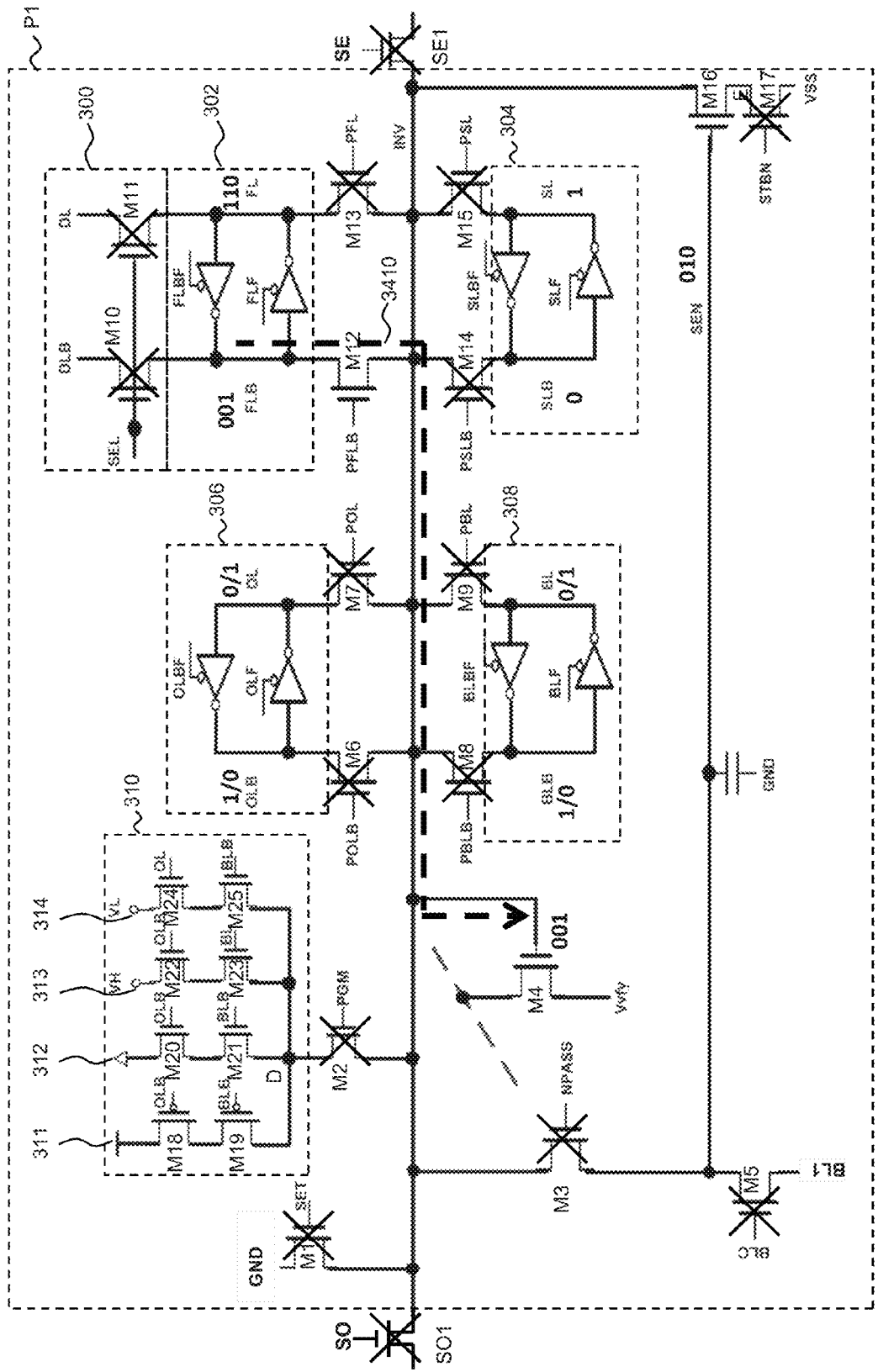

Referring to FIG. 34, controller 150 turns on switch M12 by applying a control signal PFLB with a high level ("1") to its gate. Controller 150 turns off switches M1, M2, M3, M5, M6, M7, M8, M9, M10, M11, M13, M14, M15, M17, SO1, and SE1 by respectively applying control signals SET, PGM, NPASS, BLC, POLB, POL, PBLB, PBL, SEL, SEL, PFL, PSLB, PSL, STBN, SO, and SE with a low level ("0") to the gates of these switches.

The voltage at terminal FLB is transferred to the gate of switch M4 via a path 3410. Switch M4 is turned on or off based on the voltage at its gate. In the first situation, cell A has been program inhibited, $V_{FLB}$="0". Thus, switch M4 is off. As a result, the verify voltage $V_{vfy}$ applied at the second terminal of switch M4 cannot be transferred to the detector connected to the first terminal of switch M4.

In the second situation, cell A has been programmed but has not reached the targeted level, $V_{FLB}$="0". Thus, switch M4 is off. As a result, the voltage $V_{vfy}$ applied at the second terminal of switch M4 cannot be transferred to the detector connected to the first terminal of switch M4.

In the third situation, cell A has been programmed to the targeted level, $V_{FLB}$="1". Thus, switch M4 is on. As a result, the voltage $V_{vfy}$ applied at the second terminal of switch M4 is transferred to the detector connected to the first terminal of switch M4 (not shown).

Although in the above-disclosed embodiments, the odd switches and even switches for connecting the neighboring page buffers are formed of NMOS transistors, the disclosure is not so limited. Alternatively, the odd switches and even switches can be formed of other types of transistors such as, for example, PMOS transistors, bipolar junction transistors, or any circuit or device to connect a page buffer for data transfer, etc.

Although in the above-disclosed embodiments, switches M1 to M17 are formed of NMOS transistors, the disclosure is not so limited. Alternatively, switches M1 to M17 can be formed of PMOS transistors.

Although the above-disclosed embodiments process the data in the neighboring page buffers for the programming operation, the disclosure is not so limited. Alternatively, the data in the neighboring page buffers can be processed for a reading operation, or an erasing operation.

Although in the above-disclosed embodiments, input data "1" represents that a selected cell will be program inhibited and input data "0" represents that the selected cell will be programmed, the disclosure is not so limited. Alternatively, input data "1" can represent that a selected cell will be program and input data "0" represents that the selected cell will be program inhibited, Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A page buffer circuit, comprising:
    a plurality of page buffers including a first page buffer,
    wherein the first page buffer includes a common terminal connected to at least one neighboring page buffer, and is configured to load input data of the first page buffer and input data of the at least one neighboring page buffer,
    the first page buffer includes a bias voltage application unit to provide a plurality of bias voltage levels,
    the bias voltage application unit is connected to the common terminal via a program switch, and
    the program switch is controlled by a program signal to conduct a voltage having one of the bias voltage levels to a bit line.

2. The page buffer circuit of claim 1, wherein the first page buffer is further configured to:
    process the input data of the first page buffer and the input data of the at least one neighboring page buffer to determine the bias voltage level of the voltage to be conducted to the bit line.

3. The page buffer circuit of claim 2, wherein the first page buffer is further configured to:
    apply the voltage having the determined bias voltage level to the bit line.

4. The page buffer circuit of claim 1, wherein the first page buffer includes:
    a first latch for loading the input data of the first page buffer; and
    a second latch for loading the input data of the neighboring page buffer.

5. The page buffer of claim 4, wherein each one of the first latch and the second latch includes:
   two inverters reversely coupled to each other in parallel;
   a first terminal disposed at one end of one of the two inverters;
   a second terminal disposed at an opposite end of the one of the two inverters;
   a first switch connected between the first terminal and the common terminal of the page buffer; and
   a second switch connected between the second terminal and the common terminal of the page buffer.

6. The page buffer of claim 1, wherein the bias voltage application unit includes:
   a first path connected to receive a voltage having a first bias voltage level;
   a second path connected to receive a voltage having a second bias voltage level;
   a third path connected to receive a voltage having a third bias voltage level; and
   a fourth path connected to receive a voltage having a fourth bias voltage level.

7. The page buffer circuit of claim 1, wherein the at least one neighboring page buffer is a first-side neighboring page buffer, the first page buffer is also connected to a second-side neighboring page buffer, and the first page buffer is configured to:
   load input data of the second-side neighboring page buffer; and
   process the input data of the first page buffer, the input data of the first-side neighboring page buffer, and the input data of the second-side neighboring page buffer to determine the bias voltage level of the voltage to be conducted to the bit line.

8. An integrated circuit, comprising:
   a memory array including a plurality of memory strings each including a plurality of memory cells;
   a page buffer circuit including a plurality of page buffers respectively connected to the plurality of memory strings,
   wherein a first page buffer of the plurality of page buffers includes a common terminal connected to at least one neighboring page buffer of the first page buffer,
   the first page buffer includes a bias voltage application unit to provide a plurality of bias voltage levels,
   the bias voltage application unit is connected to the common terminal via a program switch, and
   the program switch is controlled by a program signal to conduct a voltage having one of the bias voltage levels to a bit line of a memory string corresponding to the first page buffer.

9. The integrated circuit of claim 8, further including a control circuit configured to perform the following operations on the first page buffer:
   a data input operation that inputs data to the first page buffer;
   a data shifting operation that shifts input data of at least one of a right-side neighboring page buffer and a left-side neighboring page buffer of the first page buffer, to the first page buffer;
   a data processing operation that processes the input data of the first page buffer and the input data of the at least one of the right-side neighboring page buffer and the left-side neighboring page buffer, to determine the bias voltage level of the voltage to be conducted to the bit line; and
   a programming operation that applies the voltage having the determined bias voltage level to the bit line,
   wherein the data input operation inputs data to a first latch coupled to the common terminal of the first page buffer.

10. The integrated circuit of claim 9, wherein the data shifting operation shifts the input data of the right-side neighboring page buffer to a one-side latch coupled to the common terminal of the first page buffer, and shifts the input data of the left-side neighboring page buffer to a both-side latch coupled to the common terminal of the first page buffer.

11. The integrated circuit of claim 10, wherein each one of the first latch, the one-side latch, and the both-side latch includes:
   two inverters reversely coupled to each other in parallel;
   a first terminal disposed at one end of one of the two inverters;
   a second terminal disposed at an opposite end of the one of the two inverters;
   a first switch connected between the first terminal and the common terminal of the page buffer; and
   a second switch connected between the second terminal and the common terminal of the page buffer.

12. The integrated circuit of claim 11, wherein the data processing operation includes a neighbor data processing operation that processes the input data of the right-side neighboring page buffer and the input data of the left-side neighboring page buffer to set the data at the one-side latch and the both-side latch.

13. The integrated circuit of claim 12, wherein the data processing operation further includes a self data processing operation, following the neighbor data processing operation, that processes the input data of the first page buffer to further set the data at the one-side latch and the both-side latch.

14. The integrated circuit of claim 13, wherein the bias voltage application unit includes:
   a first path connected to receive a voltage having a first bias voltage level;
   a second path connected to receive a voltage having a second bias voltage level;
   a third path connected to receive a voltage having a third bias voltage level; and
   a fourth path connected to receive a voltage having a fourth bias voltage level.

15. A method of programming a memory cell connected to a page buffer, the method comprising:
   inputting data to the page buffer;
   shifting input data of at least one of a first neighboring page buffer and a second neighboring page buffer to the page buffer; and
   conducting, by a program switch controlled by a program signal, a voltage having one of a plurality of bias voltage levels provided by a bias voltage application unit to a bit line corresponding to the memory cell.

16. The method of claim 15, wherein the inputting data to the page buffer includes inputting data to a first latch coupled to a common terminal of the page buffer.

17. The method of claim 16, further including:
   processing the input data of the page buffer and the input data of the at least one of the first and second neighboring page buffers to determine the bias voltage level of the voltage to be applied to the bit line.

18. The method of claim 16, wherein:
   the shifting input data of the first neighboring page buffer includes shifting the input data of the first neighboring page buffer to a one-side latch coupled to the common terminal of the page buffer.

19. The method of claim 16, wherein:
the shifting input data of the second neighboring page buffer includes shifting the input data of the second neighboring page buffer to a both-side latch coupled to the common terminal of the page buffer.

20. The method of claim 19, wherein the conducting the voltage having the bias voltage level to the bit line includes turning on the programming switch connected to the common terminal.

* * * * *